United States Patent
Kim et al.

(10) Patent No.: US 10,409,169 B2
(45) Date of Patent: Sep. 10, 2019

(54) METHODS OF MANUFACTURING PHOTOMASKS, METHODS OF INSPECTING PHOTOMASKS, AND METHODS OF MANUFACTURING SEMICONDUCTOR DEVICES

(71) Applicant: Samsung Electronics Co., Ltd., Suwon-si, Gyeonggi-do (KR)

(72) Inventors: Jeong-Lim Kim, Seoul (KR); Jong-Doo Kim, Yongin-si (KR); Joong-Won Jeon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 15/481,204

(22) Filed: Apr. 6, 2017

(65) Prior Publication Data

US 2017/0371250 A1   Dec. 28, 2017

(30) Foreign Application Priority Data

Jun. 28, 2016   (KR) .................. 10-2016-0081113

(51) Int. Cl.

| | | |
|---|---|---|
| *H01L 21/31* | (2006.01) | |
| *G03F 7/20* | (2006.01) | |
| *G03F 1/26* | (2012.01) | |
| *H01L 21/8234* | (2006.01) | |
| *H01L 21/66* | (2006.01) | |
| *H01L 29/66* | (2006.01) | |
| *G03F 1/36* | (2012.01) | |

(Continued)

(52) U.S. Cl.
CPC ............ *G03F 7/70625* (2013.01); *G03F 1/26* (2013.01); *G03F 1/36* (2013.01); *G03F 1/44* (2013.01); *G03F 1/84* (2013.01); *G03F 7/70683* (2013.01); *H01L 21/823431* (2013.01); *H01L 22/12* (2013.01); *H01L 22/30* (2013.01); *H01L 29/66795* (2013.01)

(58) Field of Classification Search
CPC .... G03F 7/70625; G03F 7/70683; G03F 1/84; G03F 1/44; G03F 1/36; G03F 1/26; H01L 22/30; H01L 22/12; H01L 21/823431; H01L 29/66795
See application file for complete search history.

(56) References Cited

U.S. PATENT DOCUMENTS

| | | | |
|---|---|---|---|
| 6,561,706 B2 | 5/2003 | Singh et al. | |
| 7,016,054 B2 | 3/2006 | Barber et al. | |
| (Continued) | | | |

FOREIGN PATENT DOCUMENTS

| | | |
|---|---|---|
| KR | 10-2007-0120908 | 12/2007 |
| KR | 10-2011-0118820 | 11/2011 |
| KR | 10-2016-0008638 | 1/2016 |

*Primary Examiner* — Moin M Rahman
(74) *Attorney, Agent, or Firm* — Myers Bigel, P.A.

(57) ABSTRACT

Methods of inspecting photomasks are provided. A method of inspecting a photomask includes electronically inspecting a first mask pattern in a mask region of the photomask and refraining from electronically inspecting a separate second mask pattern in the mask region of the photomask. The first mask pattern includes a geometric feature that corresponds to at least a portion of the second mask pattern. Moreover, the mask region is outside of a scribe lane region of the photomask. Related methods of manufacturing photomasks and methods of manufacturing semiconductor devices are also provided.

15 Claims, 27 Drawing Sheets

(51) Int. Cl.
  *G03F 1/44* (2012.01)
  *G03F 1/84* (2012.01)

(56) References Cited

U.S. PATENT DOCUMENTS

| | | |
|---|---|---|
| 7,301,645 B2 | 11/2007 | Wang et al. |
| 7,642,101 B2 | 1/2010 | Liu et al. |
| 7,897,297 B2 | 3/2011 | Ke et al. |
| 8,871,409 B2 | 10/2014 | Pforr et al. |
| 2009/0191475 A1* | 7/2009 | Lee .................. B82Y 10/00 430/5 |
| 2009/0226827 A1* | 9/2009 | Jeong ................ G03F 1/34 430/30 |
| 2012/0075456 A1* | 3/2012 | Seitz ................ G01B 11/02 348/79 |
| 2014/0151699 A1* | 6/2014 | Wu .................. H01L 22/34 257/48 |
| 2016/0048080 A1 | 2/2016 | deVilliers |
| 2016/0116849 A1 | 4/2016 | Cramer et al. |

\* cited by examiner

METHODS OF MANUFACTURING PHOTOMASKS, METHODS OF INSPECTING PHOTOMASKS, AND METHODS OF MANUFACTURING SEMICONDUCTOR DEVICES

CROSS-REFERENCE TO RELATED APPLICATION

This U.S. non-provisional patent application claims priority under 35 U.S.C. § 119 to Korean Patent Application No. 10-2016-0081113, filed on Jun. 28, 2016, in the Korean Intellectual Property Office (KIPO), the contents of which are hereby incorporated by reference herein in their entirety.

BACKGROUND

The present disclosure relates to methods of manufacturing semiconductor devices. Integrated circuits can be fabricated on a semiconductor wafer using a photolithography process. As feature sizes of the integrated circuits become smaller, it may be helpful to control a uniformity of critical dimensions of features on the wafer. The critical dimension uniformity may greatly affect the yield and performance of integrated circuits formed on the wafer. The critical dimensions on the wafer may be measured by obtaining an image of an inspection pattern formed in a scribe lane region using scanning electron microscopy.

However, the inspection pattern in the scribe lane region may have a shape different from an actual logic pattern and an optical proximity correction may not be performed on the inspection pattern, and it thus may be limited in its representation of a critical dimension of the actual logic pattern in a chip region of the wafer.

SUMMARY

Example embodiments provide a method of manufacturing photomasks capable of monitoring critical dimensions of features on a photomask and a wafer.

Example embodiments provide a method of manufacturing semiconductor devices capable of monitoring critical dimensions of an actual pattern.

According to example embodiments, a method of manufacturing a photomask may include designing a layout of a first circuit mask pattern and a first monitoring mask pattern in a mask region corresponding to a chip region of a substrate. The first monitoring mask pattern may represent a critical dimension of the first circuit mask pattern. The method may include forming a first photomask that includes the first circuit mask pattern and the first monitoring mask pattern. Moreover, the method may include measuring a critical dimension of the first monitoring mask pattern of the first photomask.

A method of manufacturing a semiconductor device, according to example embodiments, may include sequentially forming a first etch target layer and a first photoresist layer on a substrate that includes a chip region and a scribe lane region. The method may include performing a first photolithography process on the first photoresist layer using a first photomask that includes a first circuit mask pattern and a first monitoring mask pattern that includes the same dimension as at least a portion of the first circuit mask pattern, to form a first photoresist pattern including a first circuit pattern structure transferred from the first circuit mask pattern and a first monitoring pattern structure transferred from the first monitoring mask pattern in the chip region, respectively. Moreover, the method may include measuring a critical dimension of the first monitoring pattern structure.

A method of inspecting a photomask, according to example embodiments, may include electronically inspecting a first mask pattern in a mask region of the photomask and refraining from electronically inspecting a separate second mask pattern in the mask region of the photomask. The first mask pattern may include a geometric feature that corresponds to at least a portion of the second mask pattern. Moreover, the mask region may be outside of a scribe lane region of the photomask.

Accordingly, since SEM inspection is performed only on the monitoring mask pattern, not the circuit mask pattern, the SEM inspection may have limited/no effect on the circuit mask region corresponding to a circuit region where an actual circuit pattern is formed.

Additionally, when the circuit mask pattern of the photomask is transferred to a wafer, an after-development inspection (ADI) and an after-etching inspection (AEI) may be performed only on a monitoring region in the chip region of the wafer corresponding to the monitoring mask region of the photomask. Thus, without the effect of the SEM inspection, a more precise pattern may be formed on the wafer.

BRIEF DESCRIPTION OF THE DRAWINGS

Example embodiments will be more clearly understood from the following detailed description taken in conjunction with the accompanying drawings.

FIG. 1 is a flow chart illustrating a method of manufacturing a photomask in accordance with example embodiments.

FIG. 2 is a plan view illustrating a photomask in accordance with example embodiments.

FIG. 3 is a plan view illustrating a photomask in accordance with example embodiments.

FIG. 4 is a plan view illustrating a layout of a first monitoring mask pattern of a first photomask of a set of photomasks in accordance with example embodiments.

FIG. 5 is a plan view illustrating a layout of a second monitoring mask pattern of a second photomask of the set of photomasks in accordance with example embodiments.

FIG. 6 is a plan view illustrating a layout of a third monitoring mask pattern of a third photomask of the set of photomasks in accordance with example embodiments.

FIG. 7 is a plan view illustrating a first corrected monitoring mask pattern created by performing an optical proximity correction on the first monitoring mask pattern in FIG. 4.

FIG. 8 is a plan view illustrating a second corrected monitoring mask pattern created by performing an optical proximity correction on the second monitoring mask pattern in FIG. 5.

FIG. 9 is a plan view illustrating a third corrected monitoring mask pattern created by performing an optical proximity correction on the third monitoring mask pattern in FIG. 6.

FIG. 10 is a plan view illustrating chip regions of a wafer to be exposed to light through the photomask in FIG. 3.

FIGS. 11 to 14 are cross-sectional views illustrating a method of forming a pattern in accordance with example embodiments.

FIGS. 15 to 34 are plan views and cross-sectional views illustrating a method of manufacturing a semiconductor device in accordance with example embodiments.

DETAILED DESCRIPTION

Figure 1:
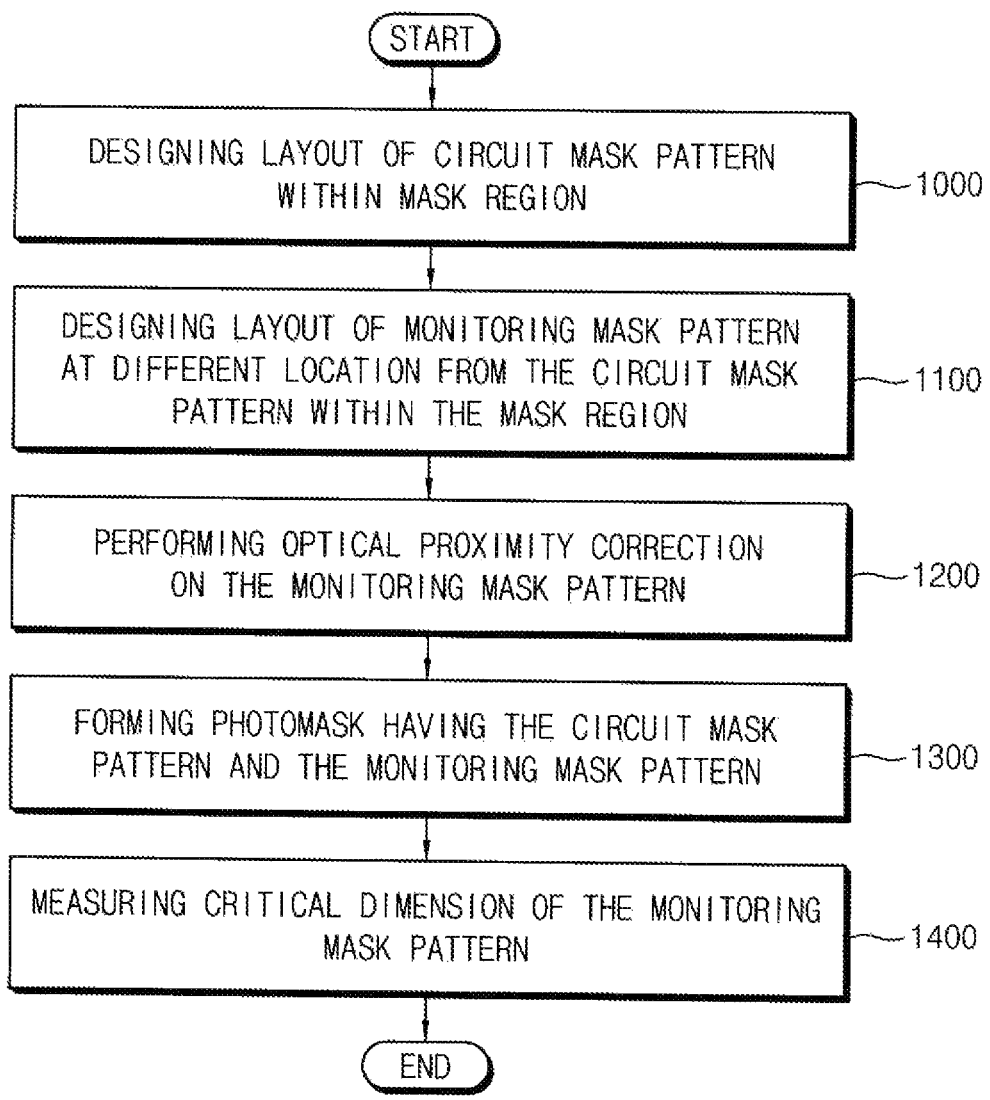
FIGS. 1 to 34 represent non-limiting, example embodiments as described herein.
Figure 2:
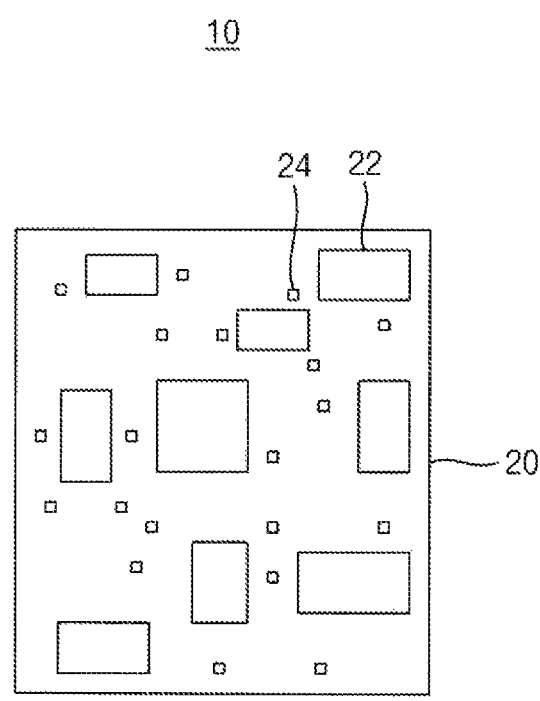
Figure 3:
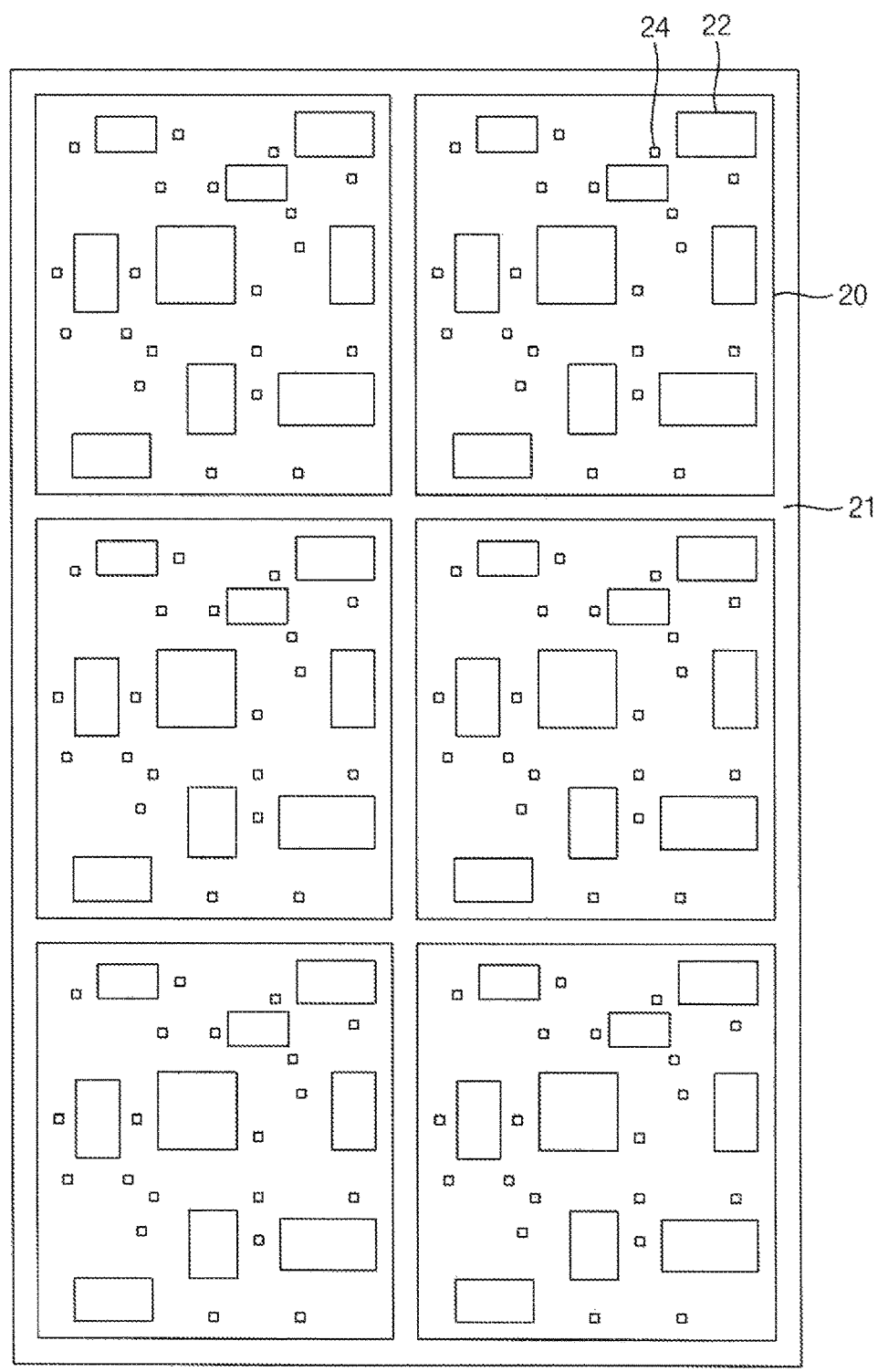

FIG. 1 is a flow chart illustrating a method of manufacturing a photomask in accordance with example embodiments. FIG. 2 is a plan view illustrating a photomask in accordance with example embodiments. FIG. 3 is a plan view illustrating a photomask in accordance with example embodiments.

Referring to FIGS. 1 to 3, in Block 1000, a layout of a circuit mask pattern may be designed within a circuit mask region 22 of a mask region 20.

In example embodiments, the layout of the circuit mask pattern may correspond to an actual circuit pattern to be formed on a substrate and may be designed within the mask region 20 of a photomask 10, 11.

A circuit layer on a semiconductor wafer may be fabricated by using a scanner to project light through the photomask to transfer a mask pattern on the photomask to the wafer. To form the circuit layer on the wafer, a photoresist layer may be deposited on the wafer, and the circuit mask pattern within the mask region 20 may be transferred to the photoresist layer by a photolithography process.

The mask region 20 may be a region corresponding to a chip region of the wafer where actual integrated circuits are formed, and the circuit mask region 22 may be a region corresponding to a cell region where actual cells are formed within the chip region of the wafer. The circuit mask pattern may be formed within the circuit mask region 22 of the mask region 20, and the circuit mask pattern may be transferred to the cell region within the chip region of the wafer.

The photomask may include one or more mask regions 20 corresponding to the number of the chip regions exposed to light by a single shot of light. The photomask 10 of FIG. 2 may include one mask region 20. One chip region may be exposed to light through the photomask 10 of FIG. 2 by a single shot of light. Six chip regions may be exposed to light through the photomask 11 of FIG. 3 by a single shot of light.

Subsequently, in Block 1100, a layout of a monitoring mask pattern may be designed within a monitoring mask region 24 of the mask region 20. FIGS. 2 and 3 illustrate that the monitoring mask region 24 is smaller (e.g., has a smaller area) than a corresponding circuit mask region 22.

In example embodiments, coordinates of the monitoring mask region 24 may be determined and the layout of the monitoring mask pattern may have the same dimension(s) as at least a portion of the circuit mask pattern. The monitoring mask pattern of the photomask pattern may be transferred to the substrate/wafer to form an actual monitoring pattern structure, and the actual monitoring pattern may have the same dimension(s) as at least a portion of the actual circuit pattern.

The monitoring mask region 24 may be determined/selected to be positioned outside the circuit mask region 22. The monitoring mask pattern may be located in a position that is not occupied by the circuit mask pattern. The monitoring mask pattern may be formed in a position that does not overlap the circuit mask pattern.

A plurality of the monitoring mask patterns may be formed respectively in the monitoring mask regions outside the circuit mask regions. The monitoring mask regions may be distributed densely and regularly across the mask region 20. Accordingly, the monitoring mask patterns may be distributed uniformly across the mask region 20. For example, about one hundred (100) or more monitoring mask regions may be predetermined in an image field per one shot. Additionally, at least one monitoring mask region 24 may be located per 2×2 mm² of the mask region 20.

A semiconductor device having integrated circuits may be fabricated on a wafer using a set of photomasks. Each of the photomasks may correspond to a patterned layer (a patterned metal layer, a patterned oxide layer, a patterned polysilicon layer, a patterned via layer, etc.) of the semiconductor device. Each of the photomasks may include a plurality of the monitoring mask regions, and corresponding monitoring mask regions on the photomasks may be positioned at the same coordinates on respective photomasks. Accordingly, the corresponding monitoring mask regions of the set of the photomasks may be positioned to overlap with one another.

The monitoring mask pattern may have the same geometric feature as at least a portion of the circuit mask pattern. The monitoring mask pattern may have dimensions capable of representing a critical dimension of the circuit mask pattern. Since the monitoring mask pattern has the same dimension(s) as at least a portion of the circuit mask pattern, the same geometric portions (having the same dimension(s)) of the circuit mask pattern and the monitoring mask pattern may be transferred to respective structures having the same dimension(s) on the wafer by the same photolithography process. The monitoring mask pattern may have a standard cell structure capable of representing an actual logic cell to be formed on the wafer.

The monitoring mask pattern and the circuit mask pattern within the mask region 20 may be transferred to the photoresist layer by the photolithography process. Before the photomask is used to form an actual circuit pattern on a wafer, only the monitoring mask pattern on the photomask may be inspected to measure a critical dimension uniformity, a target line width, etc, and then, to determine whether the photomask conforms to a specification (e.g., a predetermined specification). Accordingly, the monitoring mask pattern may be inspected (e.g., electronically inspected), whereas a corresponding circuit mask pattern is not inspected. Methods according to various embodiments herein thus may include inspecting the monitoring mask pattern and/while refraining from inspecting (e.g., without electronically inspecting) a corresponding circuit mask pattern. If the photomask is not within specification, the circuit mask pattern may be corrected/adjusted. The monitoring mask pattern may thus be measured to determine whether a corresponding circuit mask pattern meets a predetermined specification, without directly measuring the corresponding circuit mask pattern.

Figure 4:
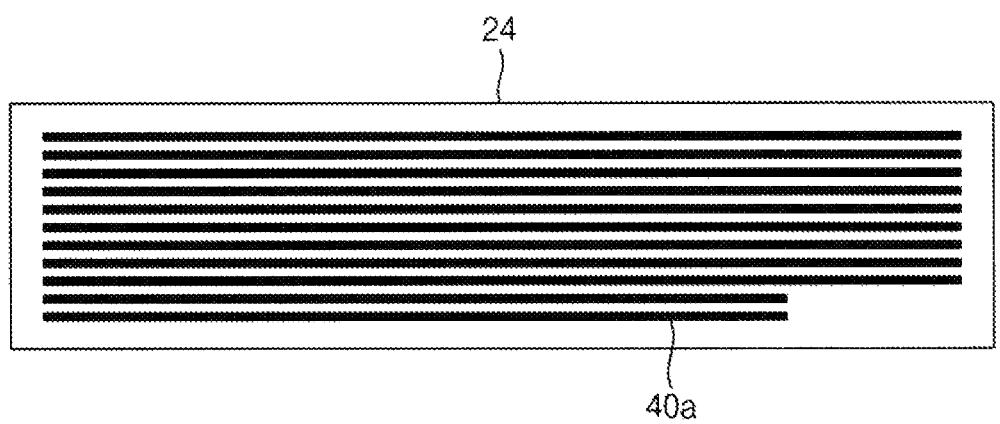
Figure 5:
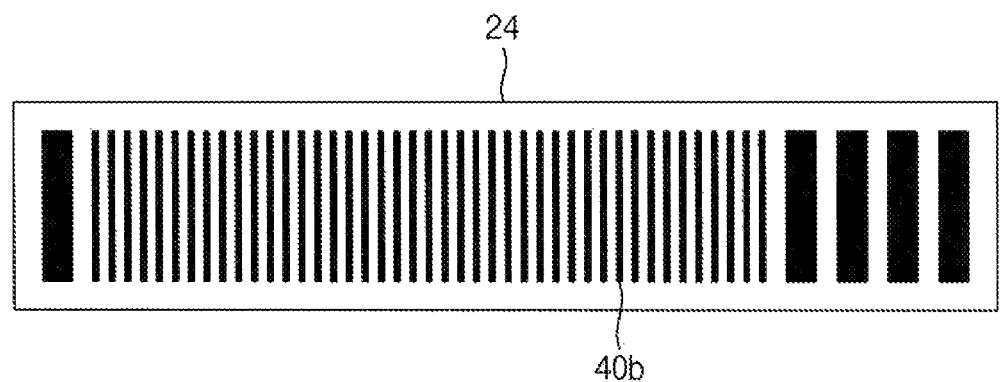
Figure 6:
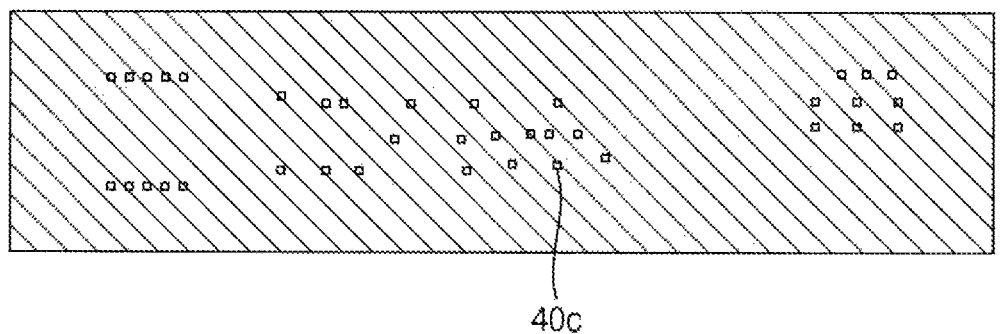

FIG. 4 is a plan view illustrating a layout of a first monitoring mask pattern of a first photomask of a set of photomasks in accordance with example embodiments. FIG. 5 is a plan view illustrating a layout of a second monitoring mask pattern of a second photomask of the set of photomasks in accordance with example embodiments. FIG. 6 is a plan view illustrating a layout of a third monitoring mask pattern of a third photomask of the set of photomasks in accordance with example embodiments.

As illustrated in FIG. 4, a layout of a first photomask may include a first monitoring mask pattern 40a representing a first circuit mask pattern which is transferred to an active fin of an actual logic cell. The first monitoring mask pattern 40a may be arranged within a monitoring mask region 24. The first monitoring mask pattern 40a may include a plurality of lines (i.e., line shapes) that are spaced apart from each other.

As illustrated in FIG. 5, a layout of a second photomask may include a second monitoring mask pattern 40b representing a second circuit mask pattern which is transferred to a dummy gate pattern of the actual logic cell. The second monitoring mask pattern 40b may be arranged within a monitoring mask region 24. The second monitoring mask pattern 40b may include a plurality of lines spaced apart from each other.

As illustrated in FIG. 6, a layout of a third photomask may include a third monitoring mask pattern 40c representing a third circuit mask pattern which is transferred to a via pattern of the actual logic cell. The third monitoring mask pattern 40c may be arranged within a monitoring mask region 24. The third monitoring mask pattern 40c may include a plurality of dot shapes (e.g., loop shapes, circular shapes, or rectangular shapes) arranged in an array.

Subsequently, in Block 1200, an optical proximity correction (OPC) may be performed on the monitoring mask pattern. Additionally, an optical proximity correction may be performed on the circuit mask pattern.

In example embodiments, the optical proximity correction may include correcting a layout of a pattern in order to compensate for image errors due to diffraction or process effects. The optical proximity correction may include enlarging the whole size of the monitoring mask pattern and the circuit mask pattern and processing corners of each of the patterns. The optical proximity correction may include moving edges or adding extra polygons to each pattern. The optical proximity correction may be driven by pre-computed look-up tables. However, it may not be limited thereto, and the OPC may be driven by various methods.

In example embodiments, a first OPC may be performed on the monitoring mask pattern, and a second OPC may be separately performed on the circuit mask pattern. The first OPC may be performed on the monitoring mask pattern to create a corrected monitoring mask pattern, and the second OPC may be performed on the circuit mask pattern to create a corrected circuit mask pattern.

The first OPC may be performed on the monitoring mask pattern in consideration of a precise and convenient inspection for the critical dimensions after manufacturing a photomask. For example, to inhibit/prevent an inaccurate measurement due to OPC jog and a local error term, an OPC pattern may be optimized to improve a region of interest (ROI) and to make measurements at multiple locations possible.

The first OPC may be performed prior to the second OPC. The first OPC may be performed on a layout of the monitoring mask pattern within the mask region 20 which is found out through pattern matching, to create the corrected mask pattern.

Additionally, the first OPC on the monitoring mask pattern may include inserting a sub-resolution assist feature in the monitoring mask region 24. The insertion of the sub-resolution assist may provide a great coverage on a line-space layout and an excellent coverage on a complicated/complex two-dimensional (2D) layout with a fast run time.

Figure 7:
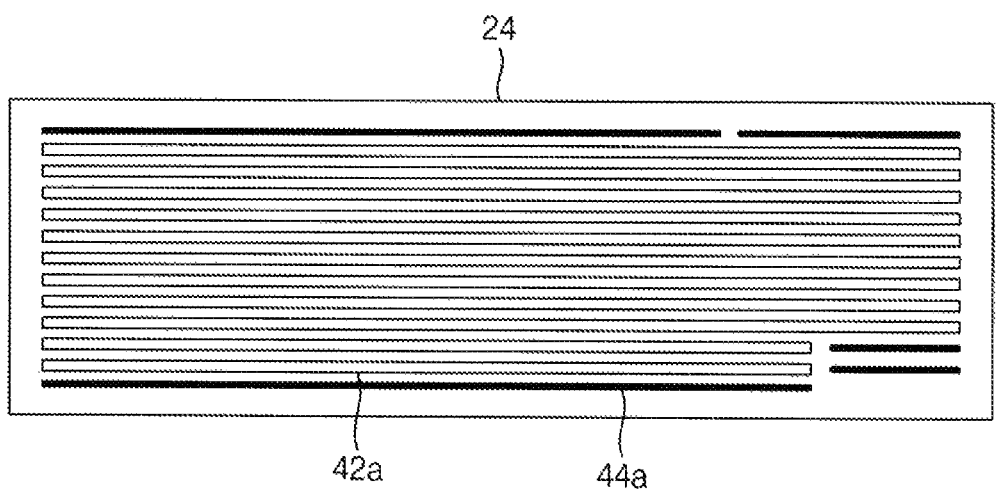
Figure 8:
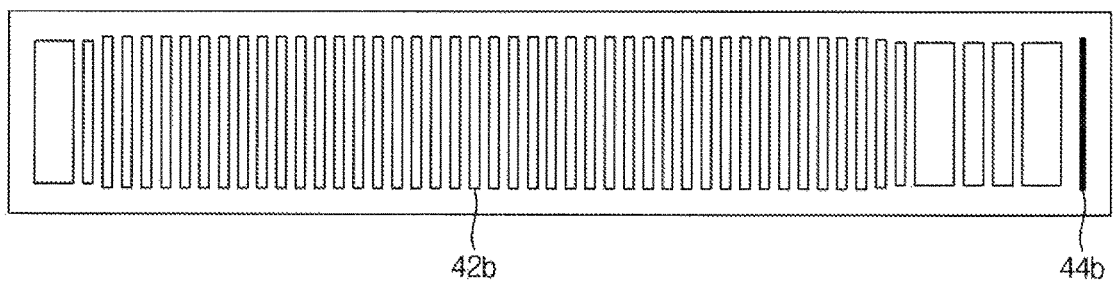
Figure 9:
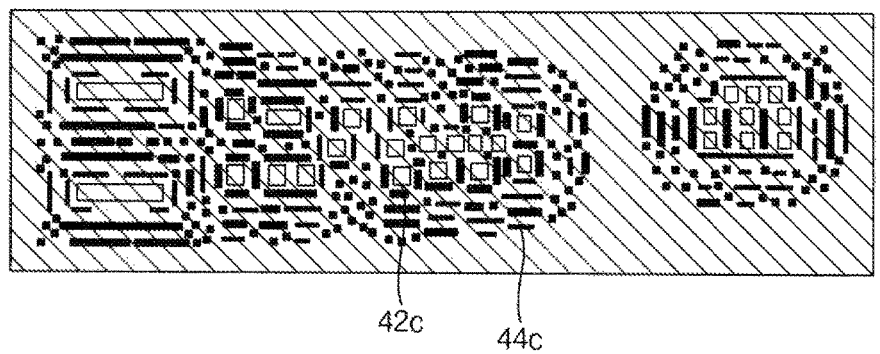

FIG. 7 is a plan view illustrating a first corrected monitoring mask pattern created by performing an optical proximity correction on the first monitoring mask pattern in FIG. 4. FIG. 8 is a plan view illustrating a second corrected monitoring mask pattern created by performing an optical proximity correction on the second monitoring mask pattern in FIG. 5. FIG. 9 is a plan view illustrating a third corrected monitoring mask pattern created by performing an optical proximity correction on the third monitoring mask pattern in FIG. 6.

As illustrated in FIG. 7, the optical proximity correction may be performed on the first monitoring mask pattern 40a to form a first corrected monitoring mask pattern 42a. The first corrected monitoring mask pattern 42a may include lines enlarged by the correction. First sub mask pattern(s) 44a may be inserted in the monitoring mask region 24.

As illustrated in FIG. 8, the optical proximity correction may be performed on the second monitoring mask pattern 40b to form a second corrected monitoring mask pattern 42b. The second corrected monitoring mask pattern 42b may include lines enlarged by the correction. Second sub mask pattern(s) 44b may be inserted in the monitoring mask region 24.

As illustrated in FIG. 9, the optical proximity correction may be performed on the third monitoring mask pattern 40c to form a third corrected monitoring mask pattern 42c. The third corrected monitoring mask pattern 42c may include dots enlarged by the correction. Third sub mask pattern(s) 44c may be inserted in the monitoring mask region 24.

Subsequently, in Block 1300, a photomask having the circuit mask pattern and the monitoring mask pattern may be formed.

As illustrated in FIG. 3, the photomask 11 may include six mask regions 20, corresponding to six respective chip regions, and a peripheral region 21 outside the mask regions 20. The mask region 20 may correspond to a chip region of a wafer, and the peripheral region 21 may correspond to a scribe lane region.

The photomask 11 may include a transparent substrate and mask patterns formed on the transparent substrate. The mask pattern may include a circuit mask pattern and a second mask pattern in the mask region 20. The circuit mask pattern may be formed in the circuit mask region 22 of the mask region 20, and the monitoring mask pattern may be formed in the monitoring mask region 24 of the mask region 20. The circuit mask pattern and the monitoring mask pattern may include a same light-blocking material. For example, the light-blocking material may include chrome, and the transparent substrate may include amorphous silica, fused quartz, etc.

In some embodiments, the photomask 11 may further include an alignment key pattern, an overlay pattern, etc. in the peripheral region 21.

Subsequently, in Block 1400, a critical dimension (CD) of the monitoring mask pattern formed on the photomask may be measured.

In example embodiments, the critical dimension of the monitoring mask pattern within the monitoring mask region 24 of the photomask may be measured by critical dimension scanning electron microscopy (CDSEM).

The measured critical dimension may be used to determine a mean critical dimension and a critical dimension uniformity in the mask region 20. Additionally, the critical dimension uniformity on the photomask may be used together with a critical dimension uniformity on a wafer to predict process variations.

Further, if the measurement result of the critical dimension of the monitoring mask pattern is not within specification, the circuit mask pattern may be corrected/adjusted.

SEM inspection may cause damage at the measurement area and become a bottleneck for providing accurate measurement due to electron charging effects. Since the SEM inspection is performed only on the monitoring mask region 24 outside the circuit mask region 22 in the mask region 20, the SEM inspection may have limited/no effect on the circuit mask region 22 corresponding to the circuit region where an actual circuit pattern is formed.

Additionally, when the circuit mask pattern of the photomask is transferred to a wafer, an after-development inspection (ADI) and an after-etching inspection (AEI) may be performed only on a monitoring region within the chip region of the wafer corresponding to the monitoring mask region 24 of the photomask. Thus, without the effect of the SEM inspection, a more precise pattern may be formed on the wafer. The words "electronically inspecting," as used herein, may refer to electronic inspection (e.g., SEM inspection) before transferring the circuit mask pattern of the photomask to a wafer, or may refer to ADI or AEI after transferring the circuit mask pattern.

Hereinafter, a method of forming a pattern and a manufacturing a semiconductor device using the photomask in FIG. 3 will be explained.

Figure 10:
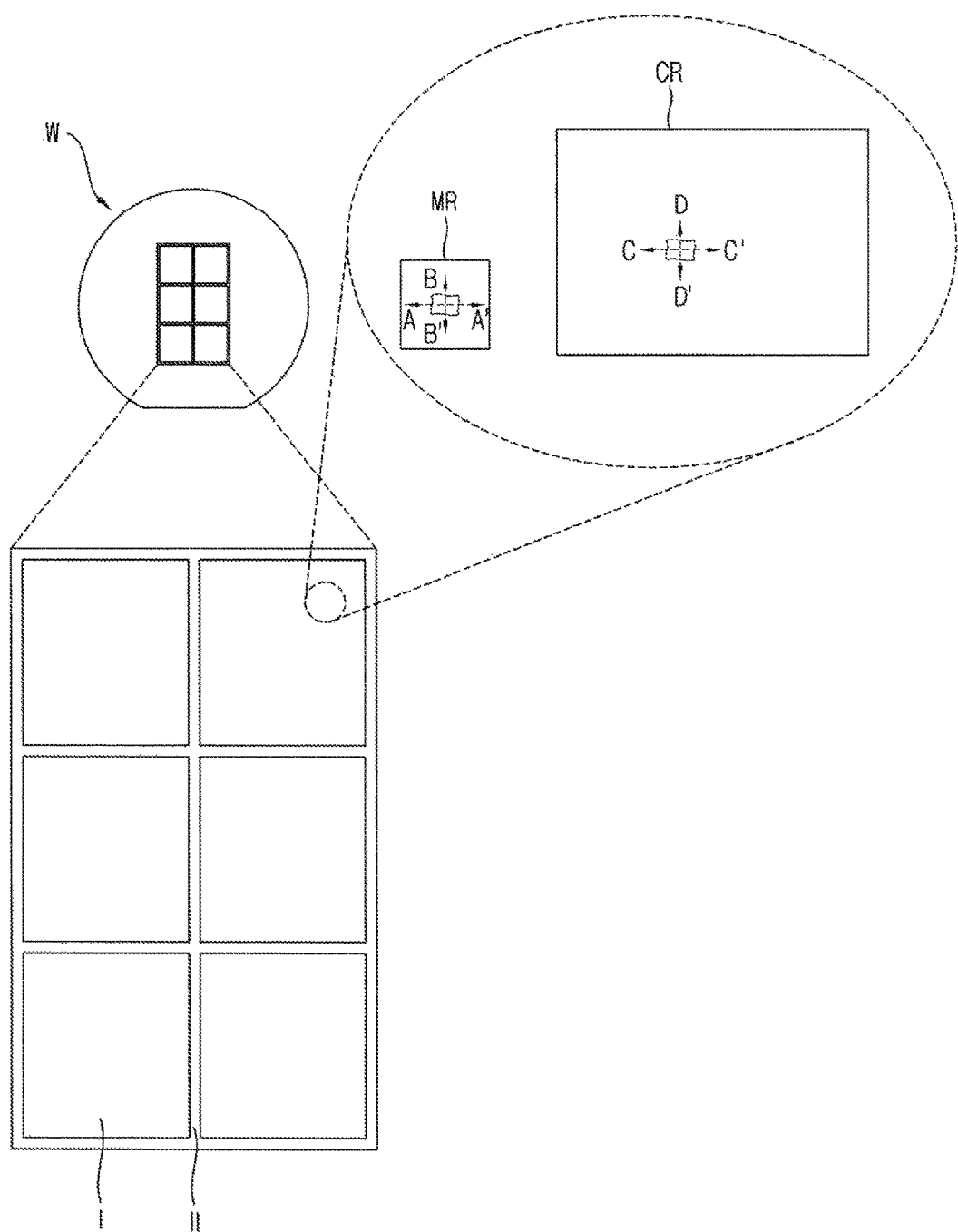

FIG. 10 is a plan view illustrating chip regions of a wafer to be exposed to light through the photomask in FIG. 3.

Referring to FIG. 10, a semiconductor wafer W may include a plurality of chip regions I and a scribe lane region II. Each of the chip regions I may be a die region where a chip is formed, and the scribe lane region may be a region which is cut by a sawing process. For example, the chip may include a logic device, a memory device, etc., and various patterns therein.

As illustrated in FIG. 10, six chip regions I may be exposed to light using the photomask 11 in FIG. 3 having six mask regions 20 by a single shot of light. Each of the chip regions I of the wafer W may include a plurality of cell regions CR and a plurality of monitoring regions MR.

The circuit mask pattern within the circuit mask region 22 of the photomask 11 may be transferred to the cell region CR within the chip region I of the wafer W, and the monitoring mask pattern within the monitoring mask region 24 of the photomask 11 may be transferred to the monitoring region MR within the chip region I of the wafer W, by a photolithography process.

FIGS. 11 to 14 are cross-sectional views illustrating a method of forming a pattern in accordance with example embodiments. FIGS. 11 to 14 are cross-sectional views taken along the line A-A' and the line C-C' of FIG. 10. The method of forming a pattern may be performed using the photomask illustrated with reference to FIGS. 1 to 9, and repeated detailed descriptions thereof may be omitted herein.

Figure 11:
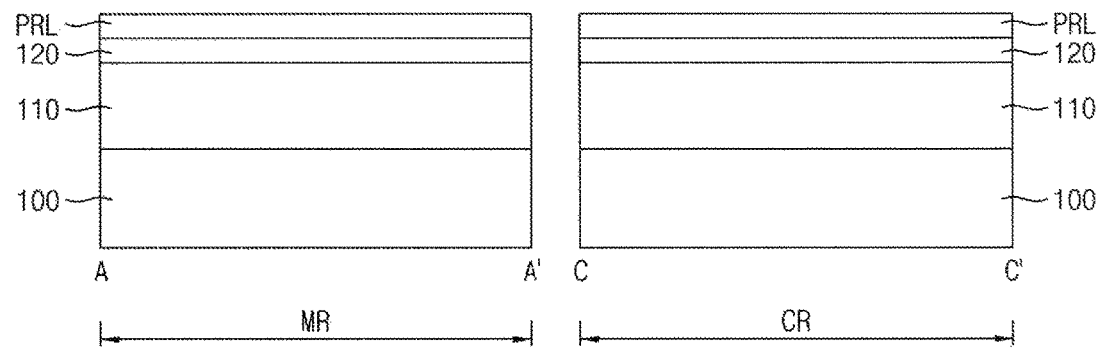

Referring to FIG. 11, first, an etch target layer 110, a hard mask layer 120 and a photoresist layer PRL may be formed on a substrate 100 including a chip region where an actual circuit layer will be formed. The chip region may include a cell region CR and a monitoring region MR. The cell region CR may be a region to which a circuit mask pattern of a photomask is transferred, and the monitoring region MR may be a region to which a monitoring mask pattern of the photomask is transferred. Here, in embodiments where a portion of the substrate 100 is etched, the etch target layer 110 may not be formed (i.e., may be omitted).

In embodiments where the etch target layer 110 is formed, the hard mask layer 120 may be formed on the etch target layer 110. The hard mask layer 120 may include a material for serving as an etching mask for the etch target layer 110. For example, the hard mask layer 120 may be formed of silicon nitride or silicon oxynitride. Alternatively, the hard mask layer 120 may be formed of silicon oxide.

An underlying layer may be formed between the hard mask layer 120 and the photoresist layer PRL. The underlying layer may include a material that can be chemically cross-linked with the photoresist layer PRL. Alternatively, the underlying layer may be omitted. After coating the photoresist layer PRL, a bake process may be performed.

Figure 12:
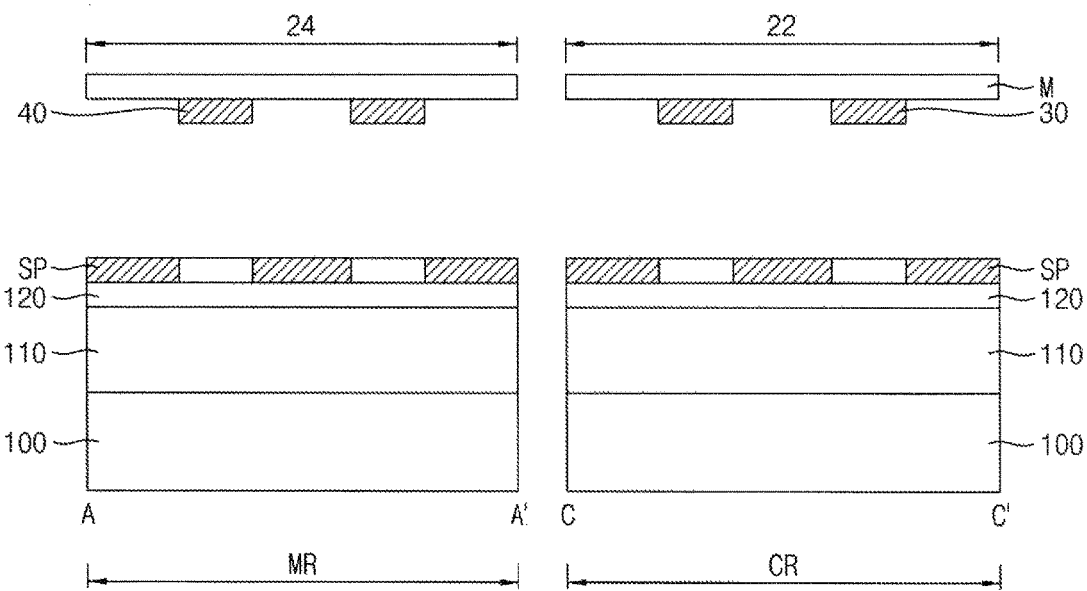
Figure 13:
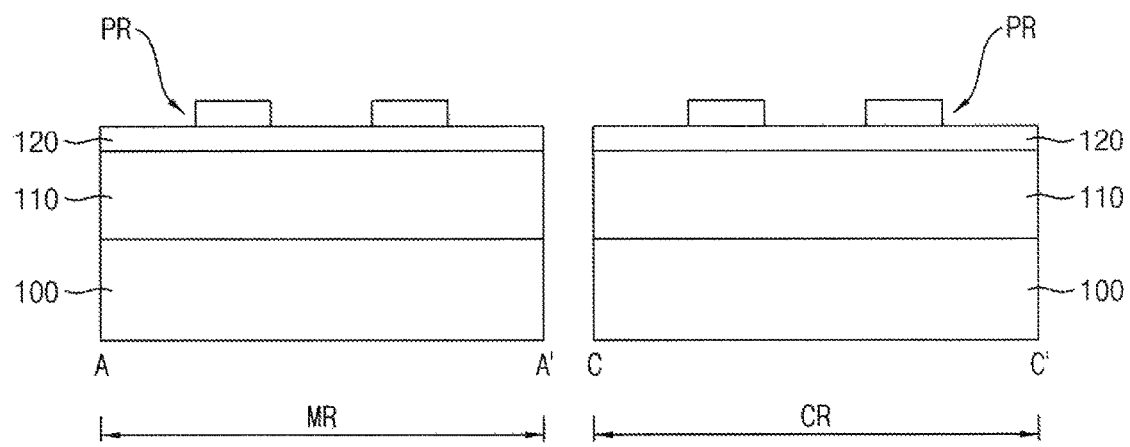

Referring to FIGS. 12 and 13, after manufacturing a photomask M (e.g., the photomask 11 illustrated with reference to FIGS. 1 and 3), a photolithography process may be performed on the photoresist layer PRL using the photomask M to form a photoresist pattern PR.

The photomask M may include a circuit mask region 22 and a monitoring mask region 24. A circuit mask pattern 30 may be formed in the circuit mask region 22, and a monitoring mask pattern 40 may be formed in the monitoring mask region 24. The monitoring mask pattern 40 may have the same geometric structure as at least a portion of the circuit mask pattern 30. The monitoring mask pattern 40 may have dimensions capable of representing a critical dimension of the circuit mask pattern 30. Since the monitoring mask pattern 40 has the same dimension as at least a portion of the circuit mask pattern 30, the monitoring mask pattern 40 may have a standard cell structure capable of representing an actual circuit pattern to be formed on the cell region CR of the substrate 100.

First, the circuit mask pattern 30 of the photomask M may be transferred to the photoresist layer PRL in the cell region CR, and the monitoring mask pattern 40 of the photomask M may be transferred to the photoresist layer PRL in the monitoring region MR by an exposure process. In embodiments where a positive tone photoresist is used, a portion SP of the photoresist layer PRL that is exposed to light may become soluble to a photoresist developer.

Then, a developing process may be performed to form the photoresist pattern PR having a circuit pattern structure in the cell region CR and a monitoring pattern structure in the monitoring region MR. For example, the exposed portion SP of the photoresist layer PRL may be dissolved by the photoresist developer to form the photoresist pattern PR. After the developing process, a post-development bake process may be performed.

In example embodiments, after forming the photoresist pattern PR, an after-development inspection (ADI) process may proceed. The ADI process may be performed only on the monitoring pattern structure in the monitoring region MR.

Additionally, a correlation/comparison between a critical dimension uniformity of the monitoring mask pattern 40 obtained by the inspection process before a supply of the manufactured photomask and a critical dimension uniformity of the monitoring pattern structure obtained by the ADI process may be calculated.

Figure 14:
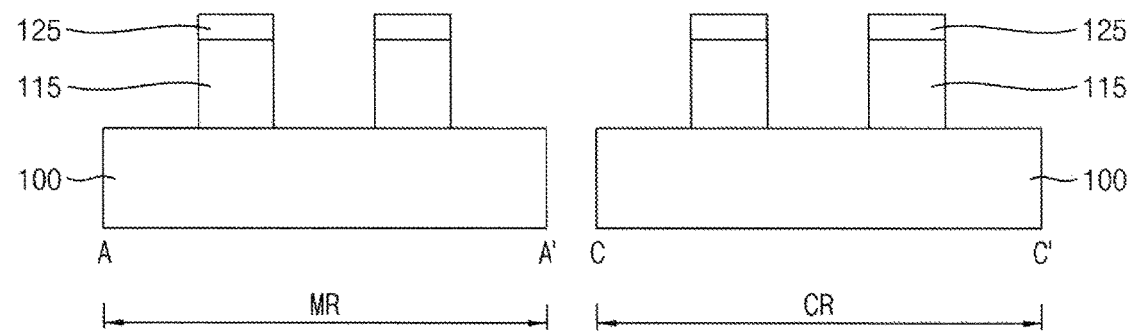

Referring to FIG. 14, the etch target layer 110 may be etched by an etching process using the photoresist pattern PR as an etching mask to form an etch target layer pattern 115.

In particular, the hard mask layer may be patterned using the photoresist pattern PR as an etching mask to form a hard mask pattern 125, and the photoresist pattern PR may be removed from the substrate 100. Then, the etch target layer 110 may be patterned using the hard mask pattern 125 as an etching mask to form the etch target layer pattern 115.

Thus, the circuit mask pattern 30 of the photomask M may be transferred to form a circuit pattern in the cell region CR of the substrate 100, and the monitoring mask pattern 40 of the photomask M may be transferred to form a monitoring pattern in the monitoring region MR of the substrate 100.

In example embodiments, after the circuit pattern and the monitoring pattern are formed on the substrate 100, an after-etching inspection (AEI) process may proceed. The AEI process may be performed only on the monitoring pattern in the monitoring region MR.

Additionally, a correlation/comparison between the critical dimension uniformity of the monitoring mask pattern, the critical dimension uniformity of the monitoring pattern structure obtained by the ADI process, and a critical dimension uniformity of the monitoring pattern obtained by the AEI process may be calculated.

FIGS. 15 to 34 are plan views and cross-sectional views illustrating a method of manufacturing a semiconductor device in accordance with example embodiments. FIGS. 16, 17, 18, 20, 21, 22, 24, 25, 26, 28, 29, 31, 33 and 34 are cross-sectional views of FIG. 10. In particular, FIGS. 24, 25, 26, 28, 29, 31, 33 and 34 are cross-sectional views taken along lines A-A' and lines C-C' of corresponding plan views, FIGS. 16, 17, 18, 20, 21 and 22 are cross-sectional views taken along lines B-B' and lines D-D' of corresponding plan views. FIGS. 15 to 34 are views illustrating portions of a cell region CR and a monitoring region MR of a chip region I of FIG. 10.

First, as described with reference to FIGS. 1 to 9, a mask layout of a circuit pattern and a monitoring pattern to be formed respectively in a cell region CR and a monitoring region MR of a wafer W where a plurality of chips including a logic device is formed, may be designed, and a photomask may be manufactured based on the designed mask layout. The manufactured photomask may correspond to a respective patterned layer of a semiconductor device including the logic device. Accordingly, a set of the photomasks corresponding to a plurality of the patterned layers which constitute the semiconductor device may be manufactured.

Figure 15:
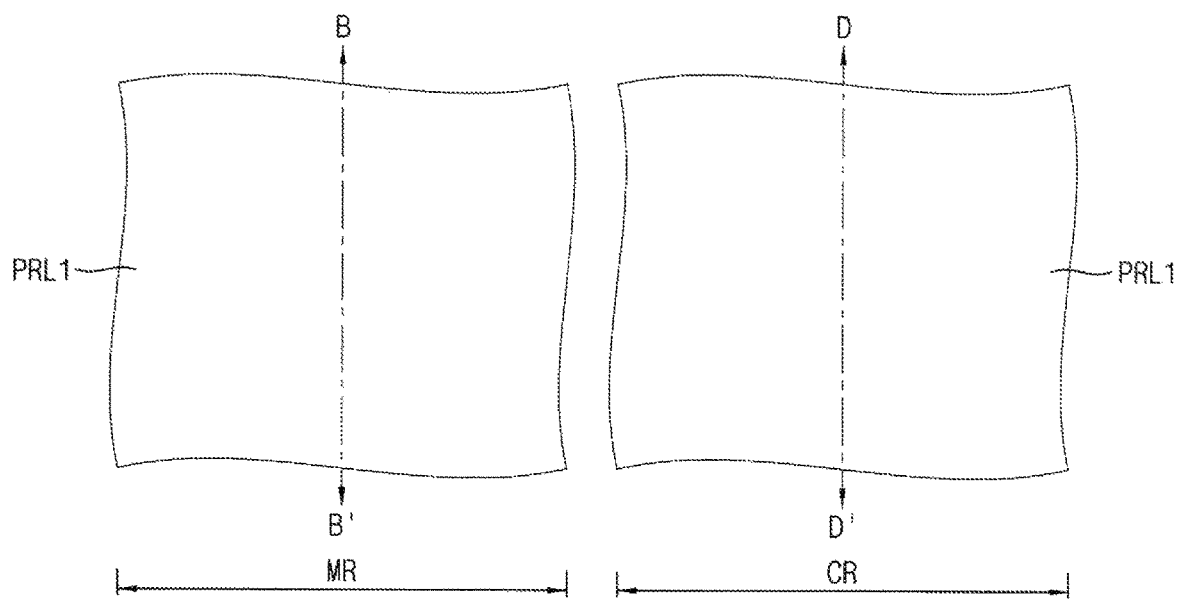
Figure 15:
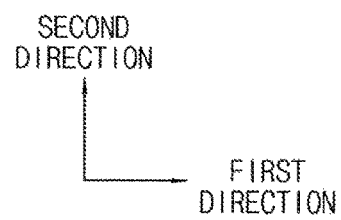
Figure 16:
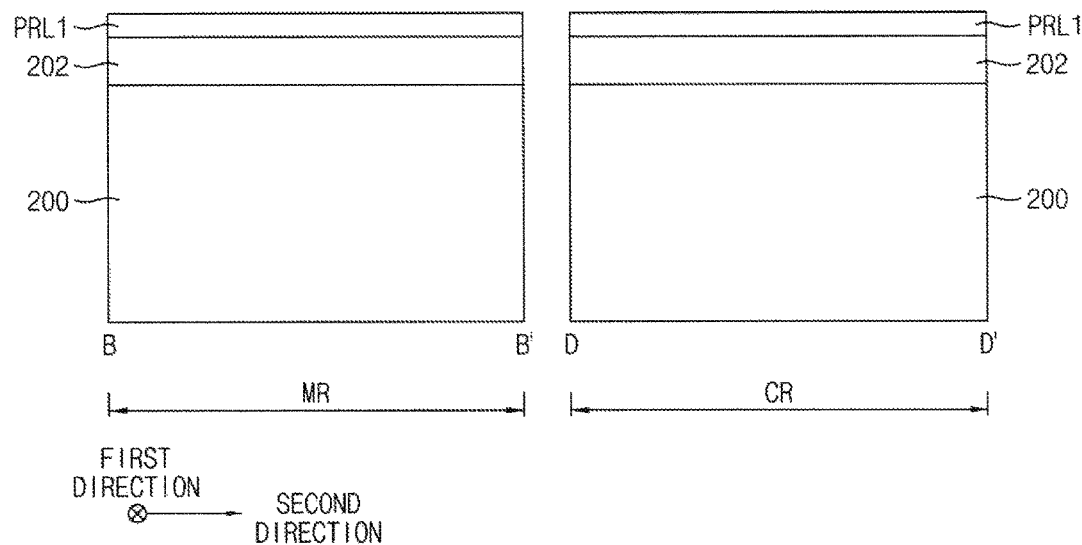

Referring to FIGS. 15 and 16, first, a hard mask layer 202 and a first photoresist layer PRL1 may be formed on a wafer 200 including a chip region having a cell region CR and a monitoring region MR.

The wafer 200 may include a semiconductor material, e.g., silicon, germanium, or the like, or III-V compound semiconductor materials, e.g., GaP, GaAs, GaSb, or the like. In some embodiments, the wafer 200 may be a silicon-on-insulator (SOI) substrate or a germanium-on-insulator (GOI) substrate.

Before forming the hard mask layer 202, impurities may be implanted into the wafer 200 by an ion implantation process to form a well region. In example embodiments, the well region may be formed by implanting p-type impurities, e.g., boron, aluminum, etc. Alternatively, the well region may be formed by implanting n-type impurities, e.g., phosphorus, arsenic, etc.

The hard mask layer 202 may include a material for serving an etching mask for the wafer 200. For example, the hard mask layer 202 may be formed of silicon nitride or silicon oxynitride. Alternatively, the hard mask layer 202 may be formed of silicon oxide.

Figure 17:
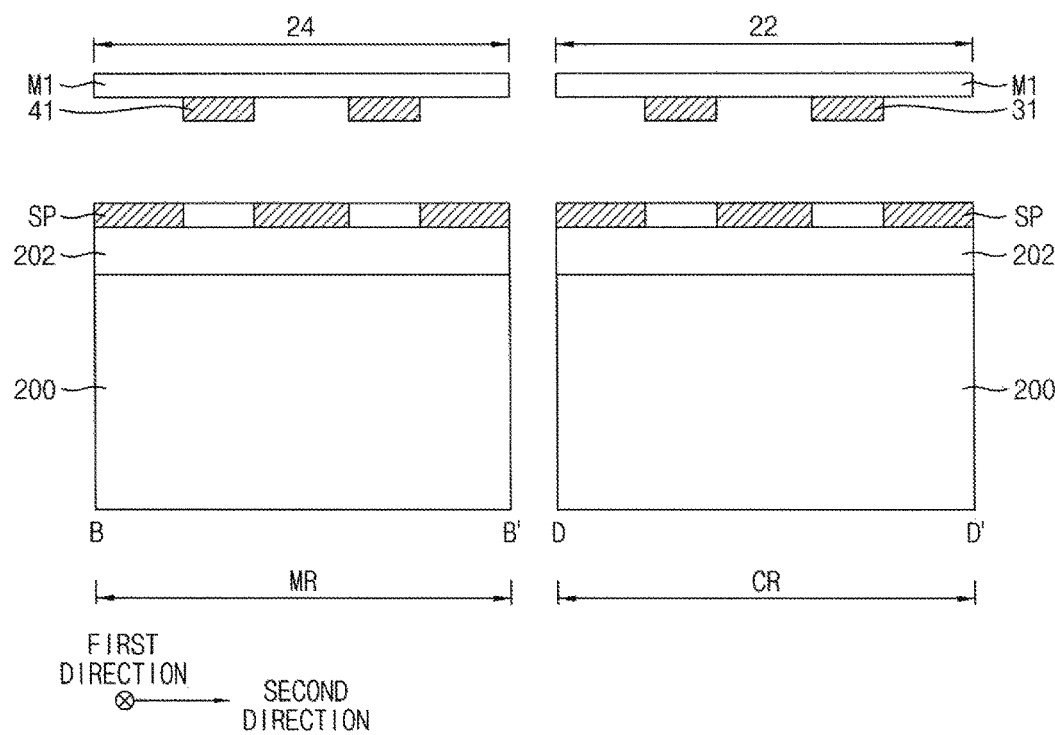
Figure 18:
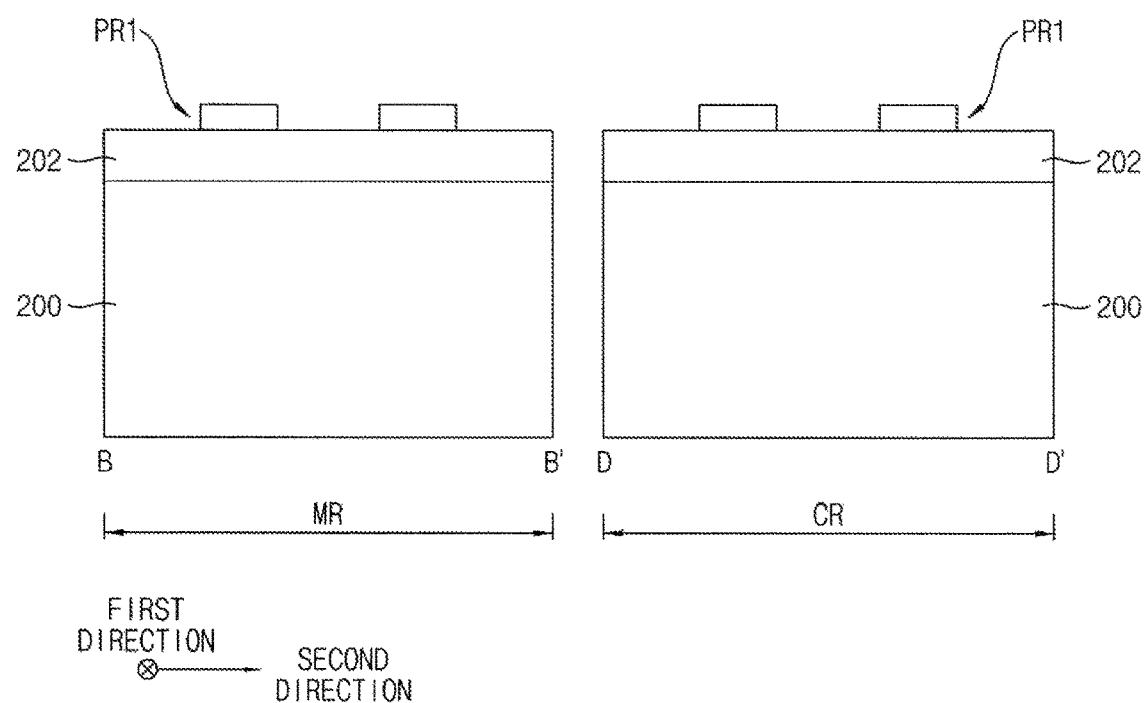

Referring to FIGS. 17 and 18, a photolithography process may be performed on the first photoresist layer PRL1 using a first photomask M1 to form a first photoresist pattern PR1.

As illustrated in FIG. 17, a first exposure process may be performed on the first photoresist layer PRL1 using the first photomask M1.

The first photomask M1 may include a circuit mask region 22 and a monitoring mask region 24. A first circuit mask pattern 31 may be formed in the circuit mask region 22, and a first monitoring mask pattern 41 may be formed in the monitoring mask region 24. The first monitoring mask pattern 41 may have the same geometric structure as at least a portion of the first circuit mask pattern 31. The first monitoring mask pattern 41 may have dimensions capable of representing a critical dimension of the first circuit mask pattern 31. Since the first monitoring mask pattern 41 has the same dimension as at least a portion of the first circuit mask pattern 31, the first monitoring mask pattern 41 may have a standard cell structure capable of representing an actual patterned layer to be formed on the cell region CR of the wafer 200.

By the first exposure process, the first circuit mask pattern 31 of the first photomask M1 may be transferred to the first photoresist layer PRL1 in the cell region CR, and the first monitoring mask pattern 41 of the first photomask M1 may be transferred to the first photoresist layer PRL1 in the monitoring region MR. In embodiments where a positive tone photoresist is used, a portion SP of the first photoresist layer that is exposed to light may become soluble to a photoresist developer.

As illustrated in FIG. 18, a first developing process may be performed to form the first photoresist pattern PR1 having a first circuit pattern structure in the cell region CR and a first monitoring pattern structure in the monitoring region MR. For example, the exposed portion SP of the first photoresist layer PRL1 may be dissolved by the photoresist developer to form the first photoresist pattern PR1. After the first developing process, a post-development bake process may be performed.

In example embodiments, after forming the first photoresist pattern PR1, an after-development inspection (ADI) process may proceed. The ADI process may be performed only on the first monitoring pattern structure in the monitoring region MR.

Additionally, a correlation between a critical dimension uniformity of the first monitoring mask pattern 41 obtained by an inspection process before manufacturing the first photomask M1 and a critical dimension uniformity of the first monitoring pattern structure obtained by the ADI process may be calculated.

Figure 19:
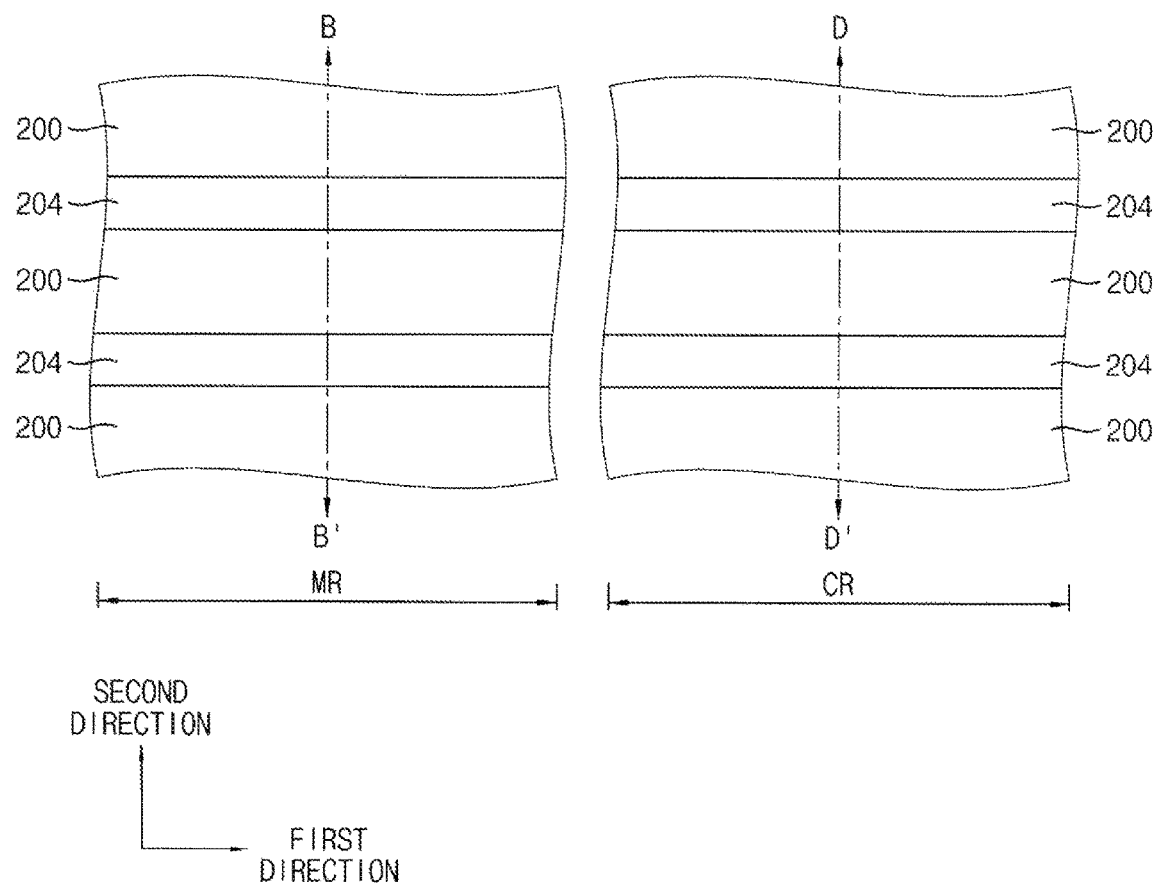
Figure 20:
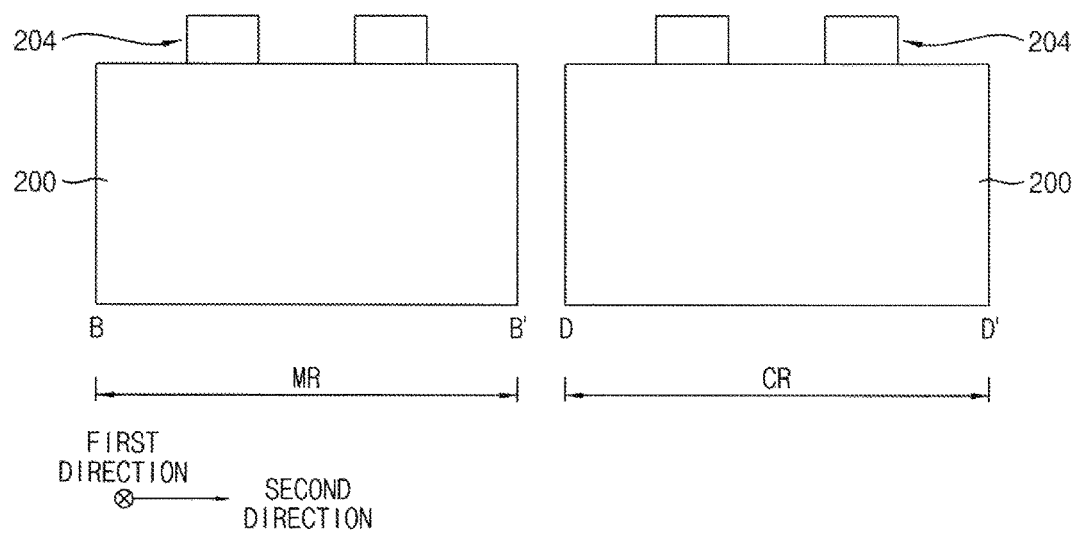
Figure 21:
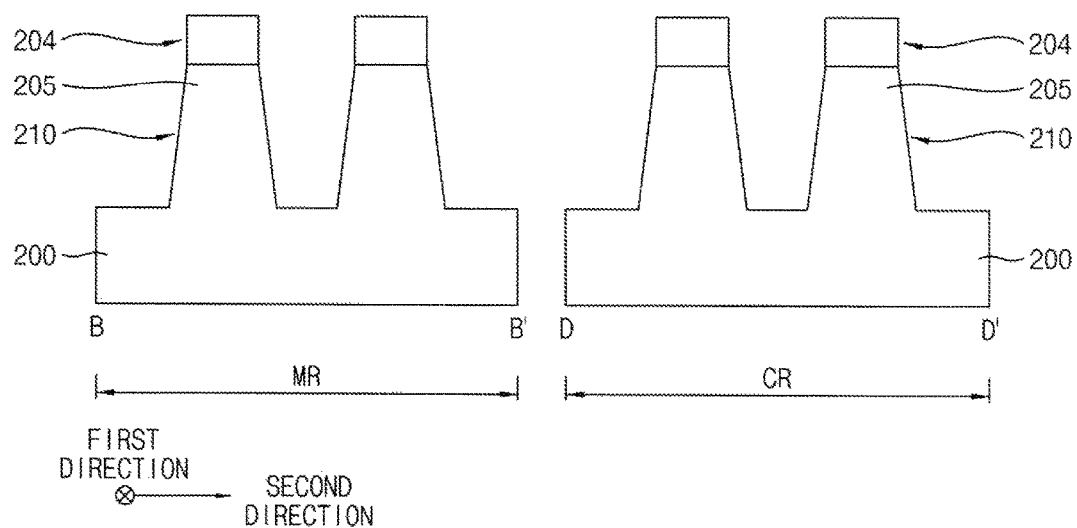

Referring to FIGS. 19 to 21, a first etching process may be performed on the wafer 200 using the first photoresist pattern PR1 as an etching mask to form a trench 210.

As illustrated in FIGS. 19 and 20, the first hard mask layer 202 may be patterned using the first photoresist pattern PR1 as an etching mask to form a first hard mask pattern 204, and the first photoresist pattern PR1 may be removed from the wafer 200. Then, as illustrated in FIG. 21, an upper portion of the wafer 200 may be partially removed using the first hard mask pattern 204 as an etching mask to form the trench 210. An active fin 205 may be defined by the trench 210 to protrude upwardly from the wafer 200.

Thus, the first circuit mask pattern 31 of the first photomask M1 may be transferred to form a first circuit pattern (active fin) in the cell region CR of the wafer 200, and the first monitoring mask pattern 41 of the first photomask M1 may be transferred to form a first monitoring pattern (active fin) in the monitoring region MR of the wafer 200.

In example embodiments, after the first circuit pattern and the first monitoring pattern are formed in the wafer 200, an after-etching inspection (AEI) process may proceed. The AEI process may be performed only on the first monitoring pattern (that is, active fin) in the monitoring region MR.

Figure 22:
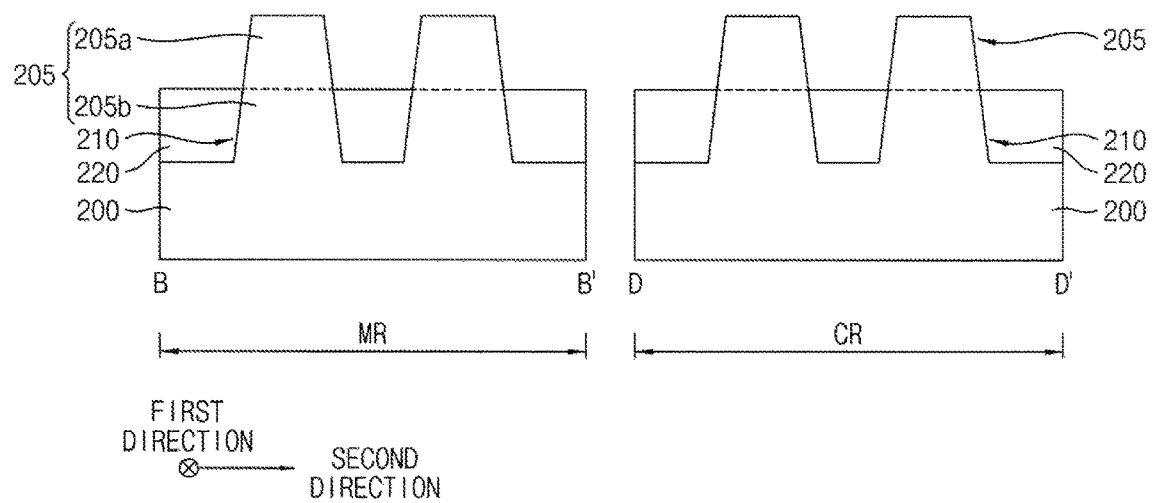

Referring to FIG. 22, an isolation layer 220 may be formed on the wafer 200 to partially fill the trench 210, to define a field region and an active region in the wafer 200.

First, an insulation layer may be formed on the wafer 200 to sufficiently fill the trench 210, the insulation layer may be planarized until a top surface of the wafer 200 may be exposed, and an upper portion of the planarized insulation layer may be removed to expose an upper portion of the trench 210, thereby forming the isolation layer 220. When the upper portion of the planarized insulation layer is removed, an upper portion of the wafer 200 adjacent thereto may be also partially removed to have a narrow width. The insulation layer may be formed of an oxide, e.g., silicon oxide.

As the isolation layer 220 is formed, the field region of which a top surface may be covered by the isolation layer 220 and the active region of which a top surface may not be covered by the isolation layer 220 may be defined in the wafer 200. The active region may protrude from the isolation layer 220 and have a fin-like shape so as to be referred to as the active fin 205. In some example embodiments, the active fin 205 may include a lower portion 205b of which a sidewall may be covered by the isolation layer 220, and an upper portion 205a of which a sidewall may not be covered by the isolation layer 220 but protrude from a top surface of the isolation layer 220.

In example embodiments, the active fin 205 may extend in a first direction substantially parallel to the top surface of the wafer 200, and a plurality of the active fins 205 may be formed in a second direction substantially parallel to the top surface of the wafer 200 and having a given angle with respect to the first direction. In some example embodiments, the second direction may have 90 degrees with respect to the first direction, and thus the first and second directions may be substantially perpendicular to each other.

Figure 23:
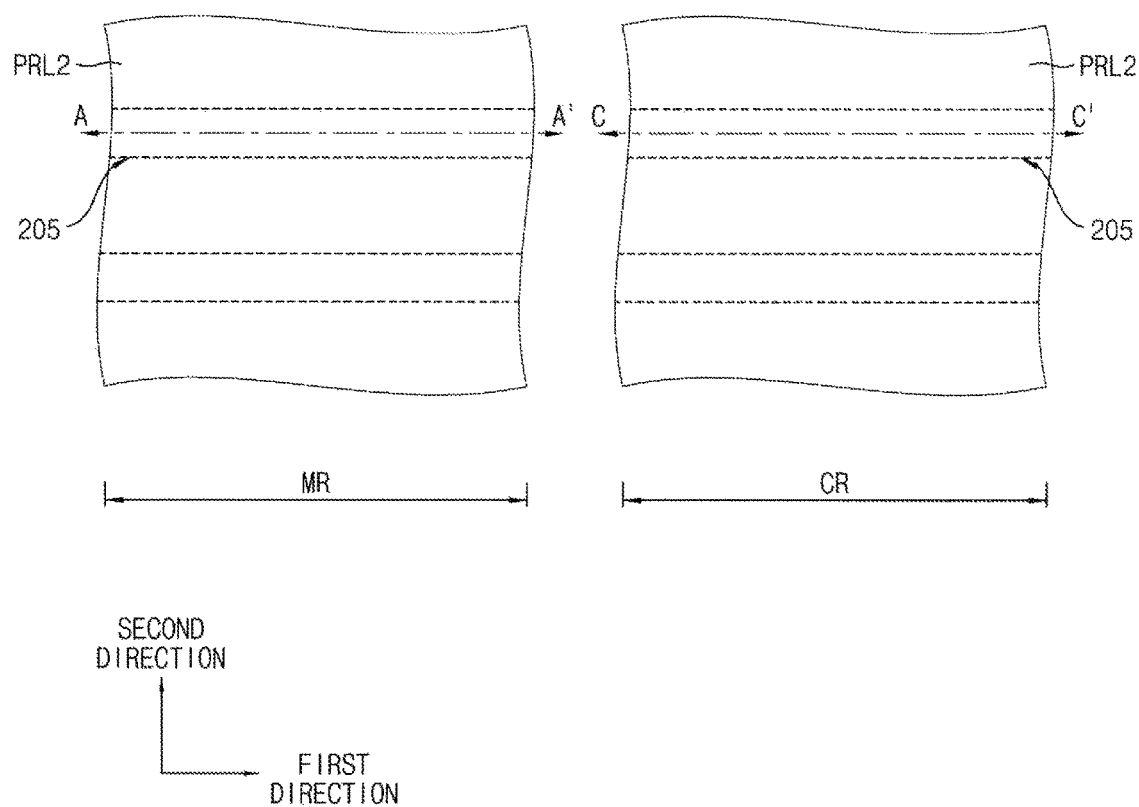
Figure 24:
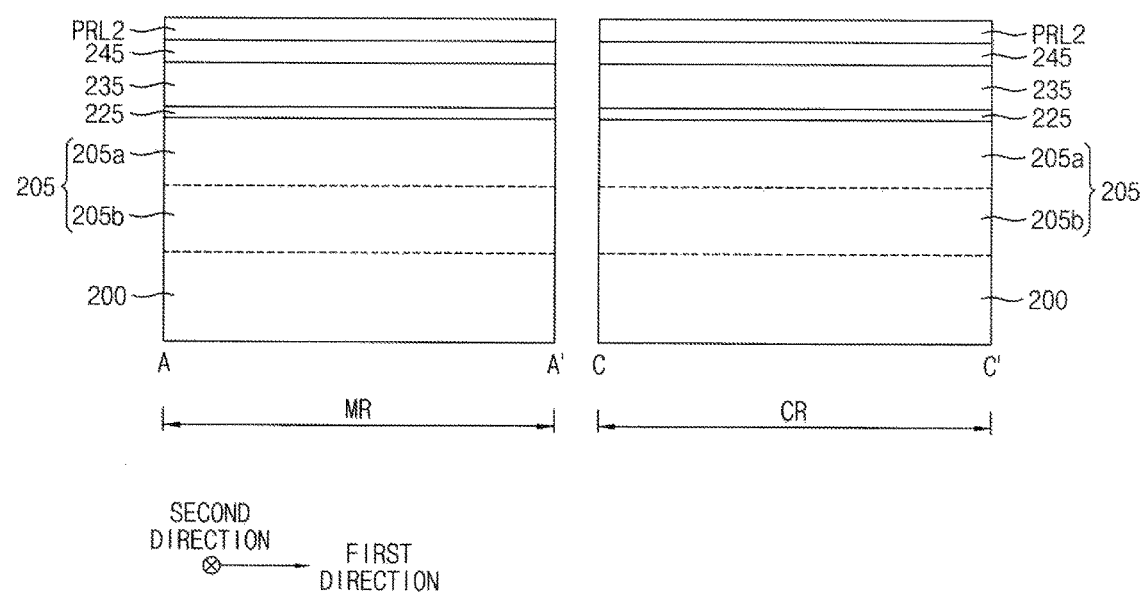

Referring to FIGS. 23 and 24, a dummy gate insulation layer 225, a dummy gate electrode layer 235, a dummy gate mask layer 245 and a second photoresist layer PRL2 may be formed on the wafer 200.

In particular, the dummy gate insulation layer 225, the dummy gate electrode layer 235, the dummy gate mask layer 245 and the second photoresist layer PRL2 may be sequentially on the active fin 205 and the isolation layer 220 on the wafer 200.

The dummy gate insulation layer 225 may be formed of an oxide, e.g., silicon oxide, the dummy gate electrode layer 235 may be formed of, e.g., polysilicon, and the dummy gate mask layer 245 may be formed of a nitride, e.g., silicon nitride. The dummy gate insulation layer 225, the dummy gate electrode layer 235 and the dummy gate mask layer 245 may be formed by a chemical vapor deposition (CVD) process, a physical vapor deposition (PVD) process, an atomic layer deposition (ALD) process, or the like. Alternatively, the dummy gate insulation layer 225 may be formed by a thermal oxidation process on an upper portion of the active fin 205.

Figure 25:
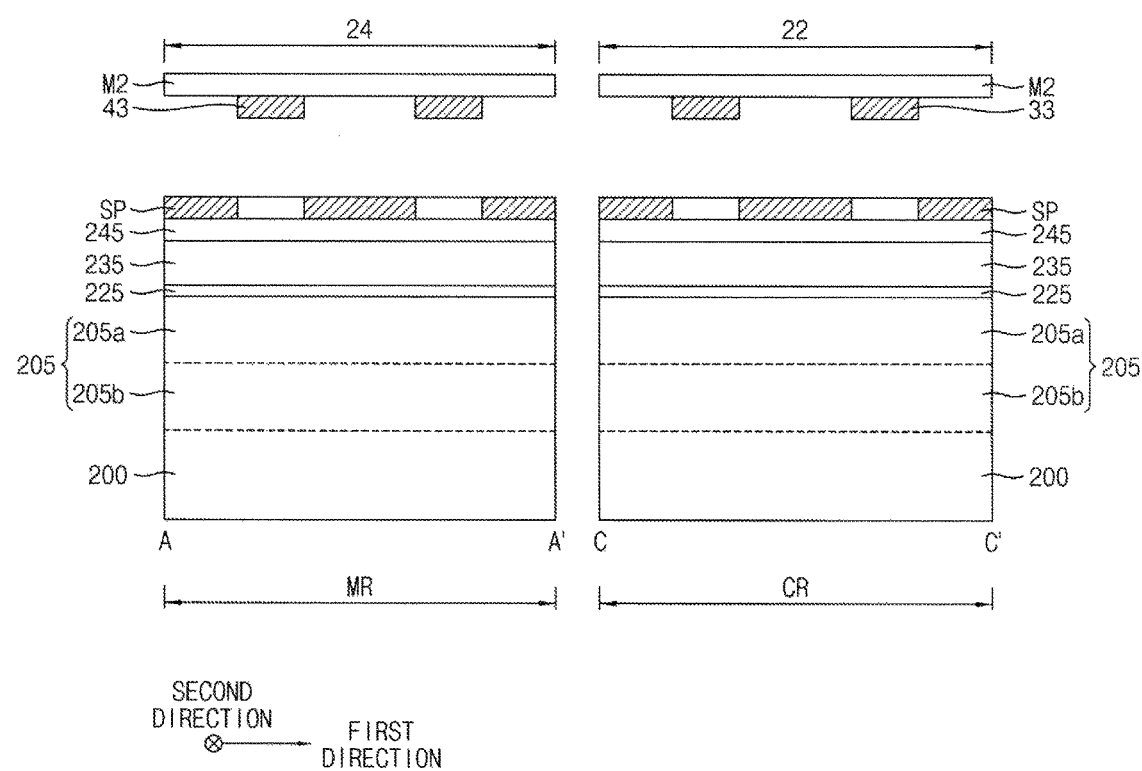
Figure 26:
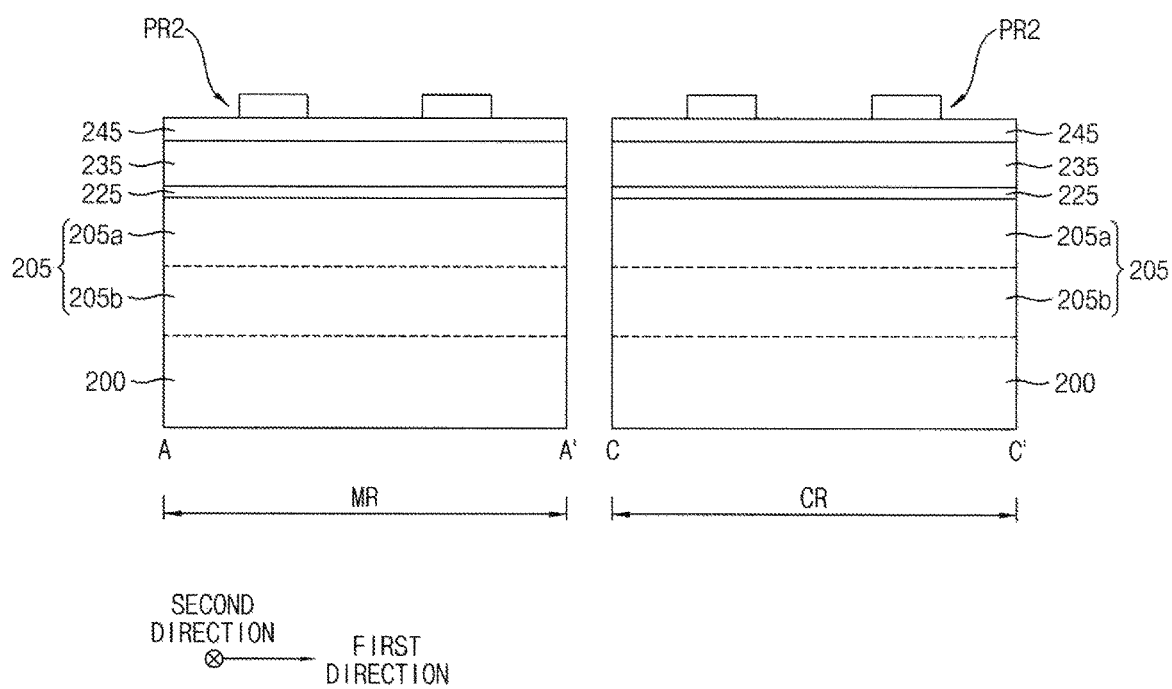

Referring to FIGS. 25 and 26, a photolithography process may be performed on the second photoresist layer PRL2 using a second photomask M2 to form a second photoresist pattern PR2.

As illustrated in FIG. 25, a second exposure process may be performed on the second photoresist layer PRL2 using the second photomask M2.

The second photomask M2 may include a circuit mask region 22 and a monitoring mask region 24. A second circuit mask pattern 33 may be formed in the circuit mask region 22, and a second monitoring mask pattern 43 may be formed in the monitoring mask region 24. The second monitoring mask pattern 43 may have the same geometric structure as at least a portion of the second circuit mask pattern 33. The second monitoring mask pattern 43 may have dimensions capable of representing a critical dimension of the second circuit mask pattern 33. Since the second monitoring mask pattern 43 has the same dimension as at least a portion of the second circuit mask pattern 33, the second monitoring mask pattern 43 may have a standard cell structure capable of representing an actual patterned layer to be formed on the cell region CR of the wafer 200.

By the second exposure process, the second circuit mask pattern 33 of the second photomask M2 may be transferred to the second photoresist layer PRL2 in the cell region CR, and the second monitoring mask pattern 43 of the second photomask M2 may be transferred to the second photoresist layer PRL2 in the monitoring region MR. In embodiments where a positive tone photoresist is used, a portion SP of the second photoresist layer that is exposed to light may become soluble to a photoresist developer.

As illustrated in FIG. 26, a second developing process may be performed to form the second photoresist pattern PR2 having a second circuit pattern structure in the cell region CR and a second monitoring pattern structure in the monitoring region MR. For example, the exposed portion SP of the second photoresist layer PRL2 may be dissolved by the photoresist developer to form the second photoresist pattern PR2. After the second developing process, a post-development bake process may be performed.

In example embodiments, after forming the second photoresist pattern PR2, an after-development inspection (ADI) process may proceed. The ADI process may be performed only on the second monitoring pattern structure in the monitoring region MR.

Additionally, a correlation/comparison between a critical dimension uniformity of the second monitoring mask pattern 43 obtained by an inspection process before manufacturing the second photomask M2 and a critical dimension uniformity of the second monitoring pattern structure obtained by the ADI process may be calculated.

Figure 27:
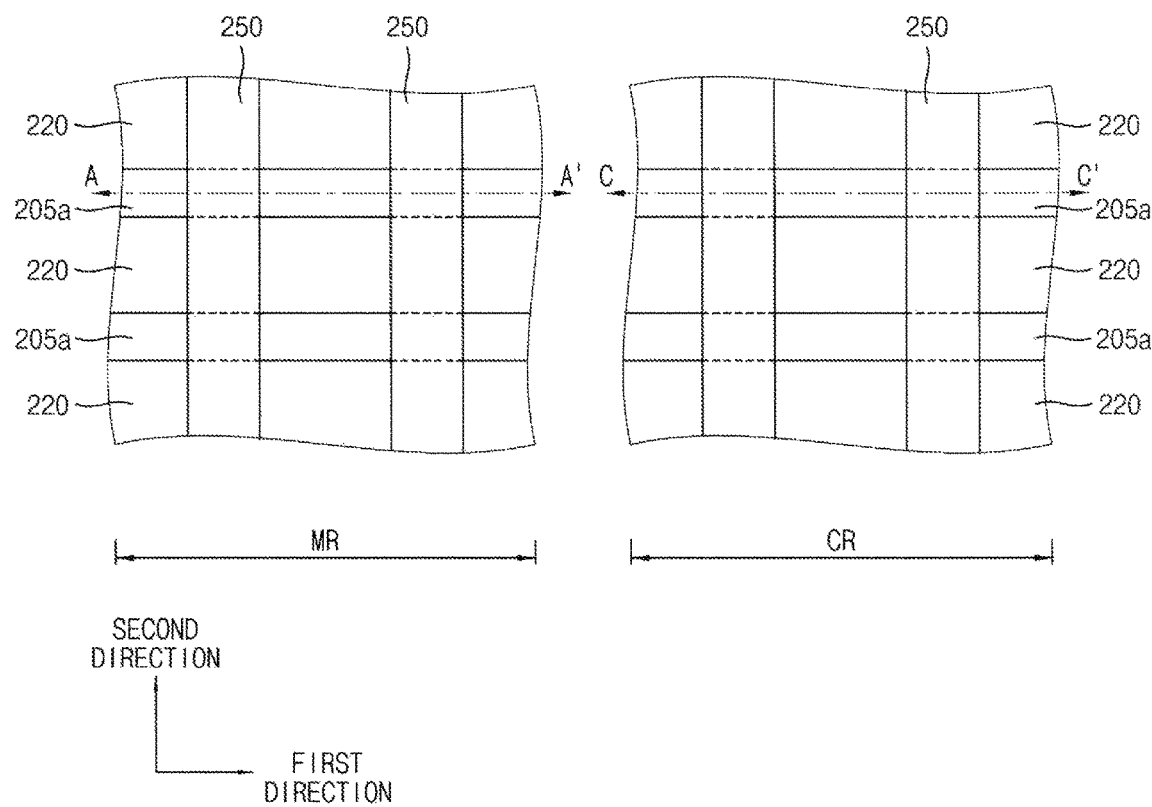
Figure 28:
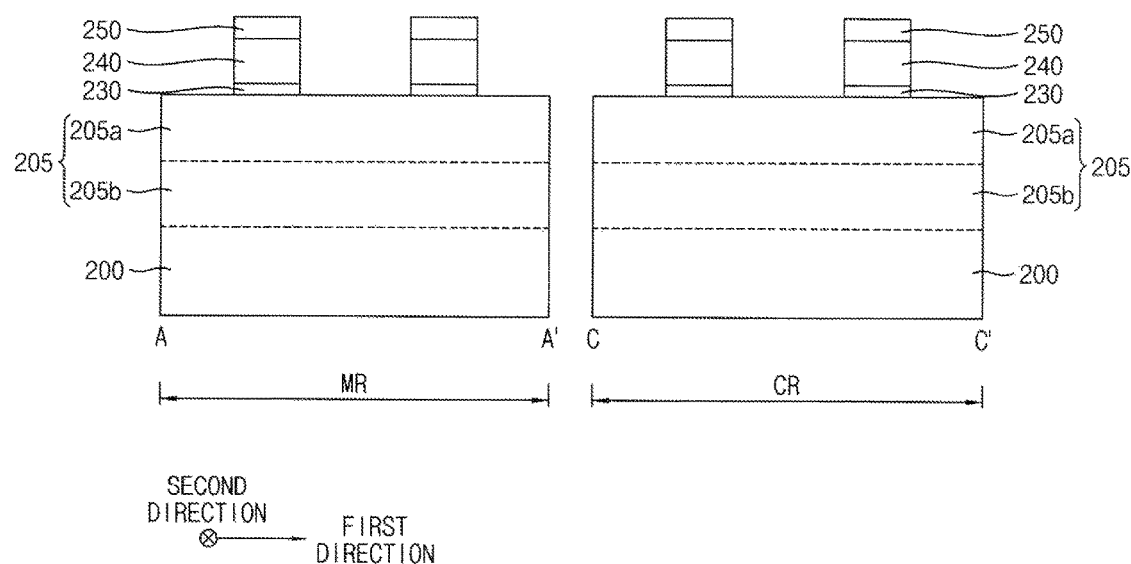

Referring to FIGS. 27 and 28, a second etching process may be performed on the wafer 200 using the second photoresist pattern PR2 as an etching mask to form a dummy gate structure.

The dummy gate mask layer 245 may be patterned using the second photoresist pattern PR2 as an etching mask to form a dummy gate mask 250, and the second photoresist pattern PR2 may be removed from the wafer 200. Then, the dummy electrode layer and the dummy gate insulation layer may be sequentially etched using the dummy gate mask 250 as an etching mask to form the dummy gate structure including a dummy gate insulation layer pattern 230, a dummy gate electrode 240, and the dummy gate mask 250.

Thus, the second circuit mask pattern 33 of the second photomask M2 may be transferred to form a second circuit pattern (dummy gate structure) in the cell region CR of the wafer 200, and the second monitoring mask pattern 44 of the second photomask M2 may be transferred to form a second monitoring pattern (dummy gate structure) in the monitoring region MR of the wafer 200.

In example embodiments, after the second circuit pattern and the second monitoring pattern are formed on the wafer 200, an after-etching inspection (AEI) process may proceed. The AEI process may be performed only on the second monitoring pattern (that is, dummy gate structure) in the monitoring region MR.

In example embodiments, the dummy gate structure may be formed to extend on the active fins 205 of the wafer 200 and the isolation layer 220 in the second direction, and a plurality of the dummy gate structures may be formed in the first direction at a constant distance from each other.

After forming the dummy gate structure, impurities may be implanted into the wafer 200 by an ion implantation process to form a halo region and a lightly doped drain (LDD) region. In example embodiments, the halo region may be formed by implanting p-type impurities, e.g., boron, aluminum, etc., and the LDD region may be formed by implanting n-type impurities, e.g., phosphorus, arsenic, etc. Alternatively, the halo region may be formed by implanting n-type impurities, and the LDD region may be formed by implanting p-type impurities.

Figure 29:
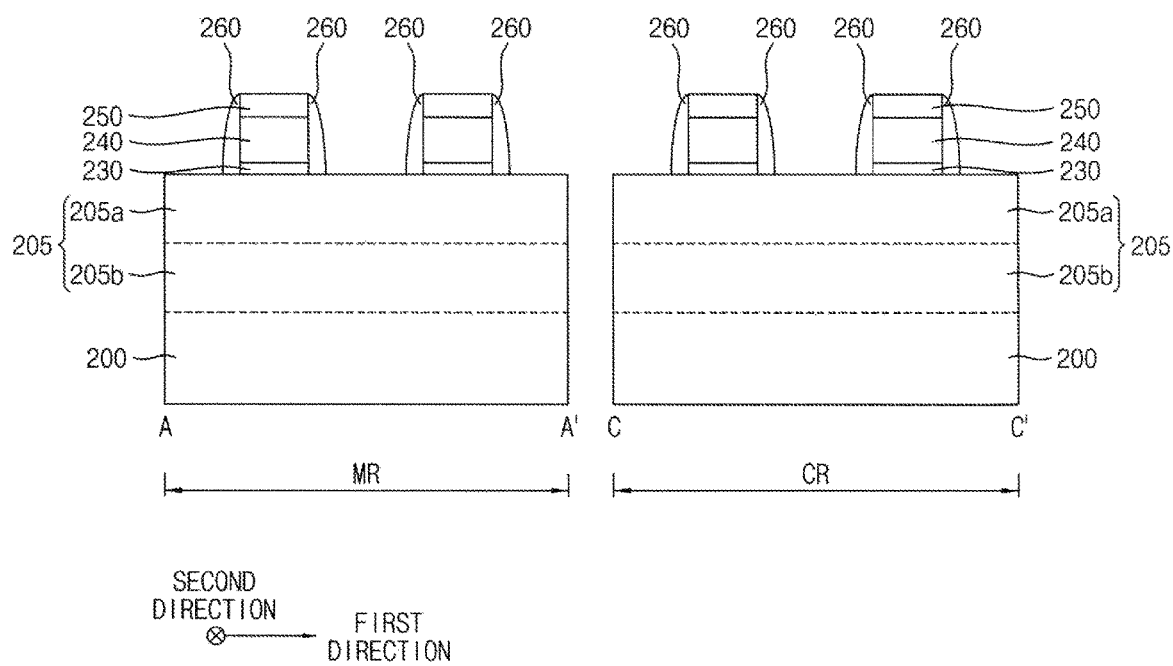
Figure 30:
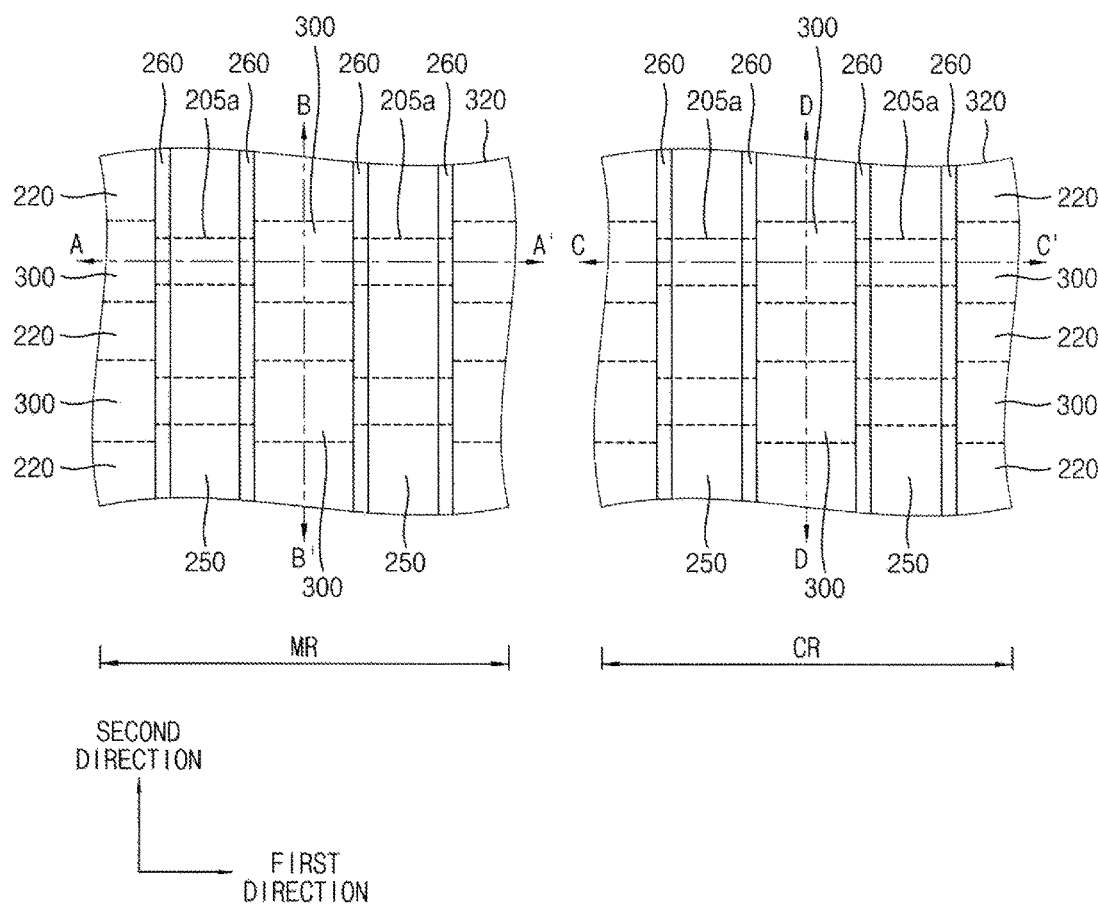
Figure 31:
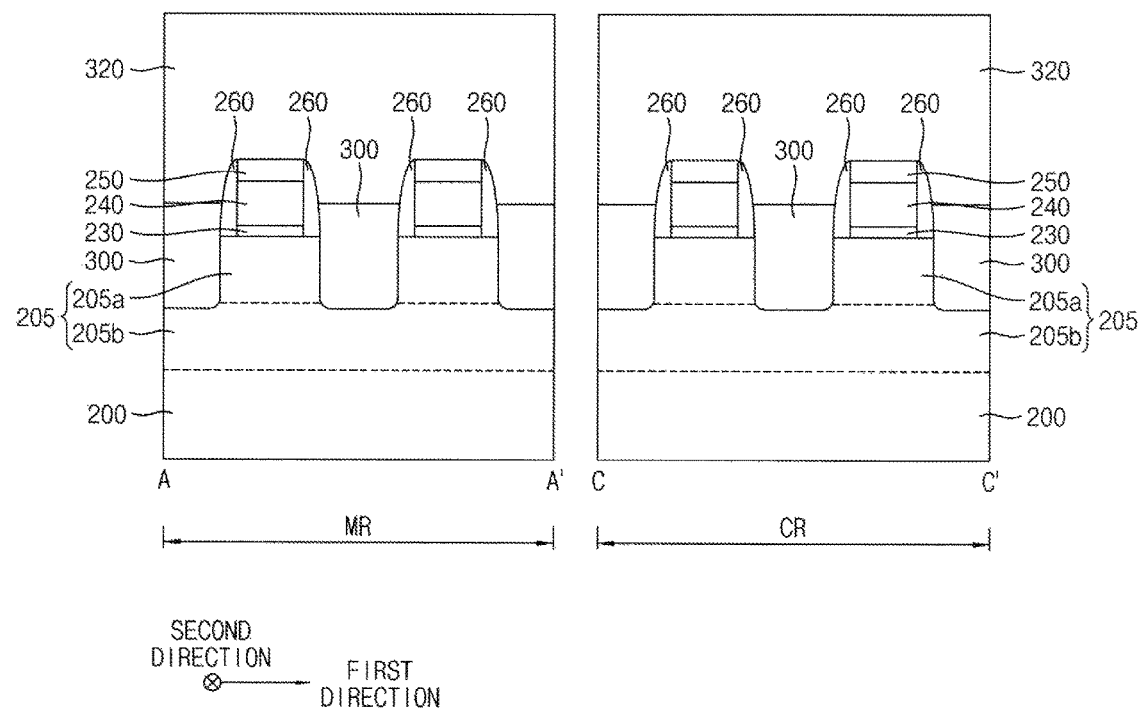

Referring to FIGS. 29 to 31, a gate spacer 260 may be formed on a sidewall of the dummy gate structure, and a portion of the active fin 205 not covered by the dummy gate structure and the gate spacer 260 may be partially etched using the dummy gate structure and the gate spacer 260 as an etching mask to form a recess. Then, an epitaxial layer 300 may be formed on the active fin 205 to fill the recess.

In example embodiments, a spacer layer may be formed on the dummy gate structure, the active fin 205 and the isolation layer 220, and the spacer layer may be anisotropically etched to form the gate spacer 260. The spacer layer may be formed of a low-k dielectric material including oxygen, e.g., silicon oxynitride, silicon oxycarbonitride, etc. in the spacer layer. The gate spacer 260 may be formed on sidewalls of the dummy gate structure opposed to each other in the first direction.

The recess may be formed by removing an upper portion 205a of the active fin 205 and partially removing a lower portion 205b of the active fin 205. Thus, the recess may have a bottom lower than a top of the lower portion 205b of the active fin 205 at which the recess is not formed.

The epitaxial layer 300 may be formed by a selective epitaxial growth (SEG) process using a portion of the active fin 205 exposed by the recess, i.e., a top surface of the lower portion 205b of the active fin 205 and a sidewall of the upper portion 205a of the active fin 205 as a seed.

Then, a first insulating interlayer 320 may be formed on the dummy gate structure, the gate spacer 260, the epitaxial layer 300 and the isolation layer 220 to have a top surface higher than that of the dummy gate structure.

Figure 32:
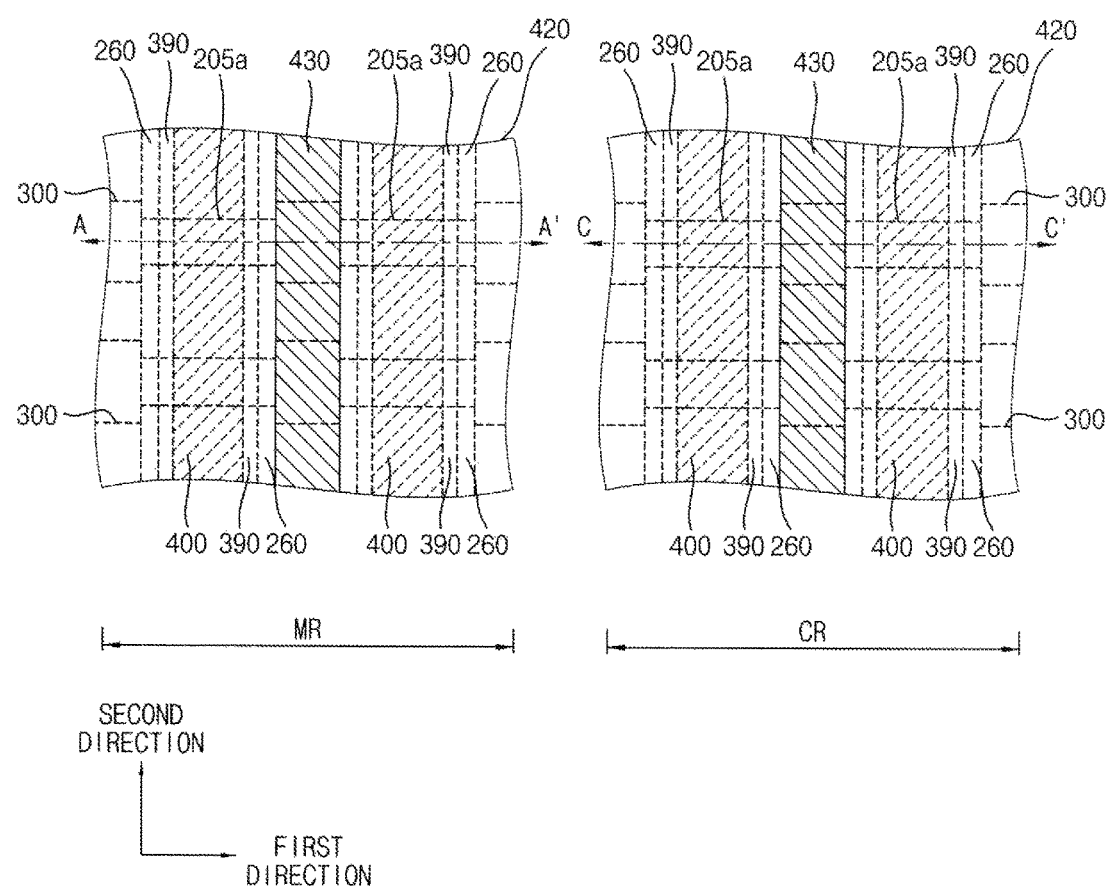
Figure 33:
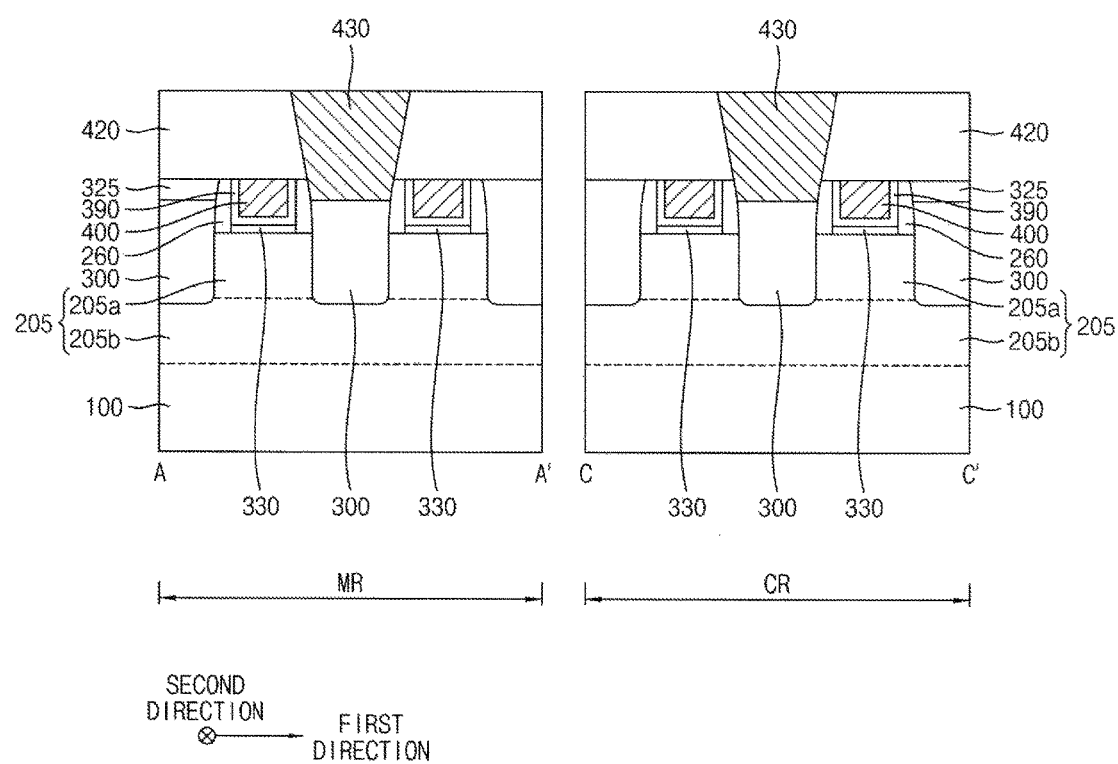

Referring to FIGS. 32 and 33, the first insulating interlayer 320 may be planarized until a top surface of the dummy gate electrode 240 of the dummy gate structure may be exposed to form a first insulating interlayer pattern 325. Then, the exposed dummy gate electrode 240 and the dummy gate insulation pattern 230 thereunder may be removed, and a gate structure including an interface pattern 330, a gate insulation pattern 390, and a gate electrode 400 sequentially stacked. The gate structure and a source/drain region may form an NMOS transistor or a PMOS transistor.

Then, a second insulating interlayer 420 may be formed on the first insulating interlayer pattern 325 to cover the transistor, and a contact plug 430 may be formed through the second insulating interlayer 420 and the first insulating interlayer pattern 325 to contact a top surface of the epitaxial layer 300.

Figure 34:
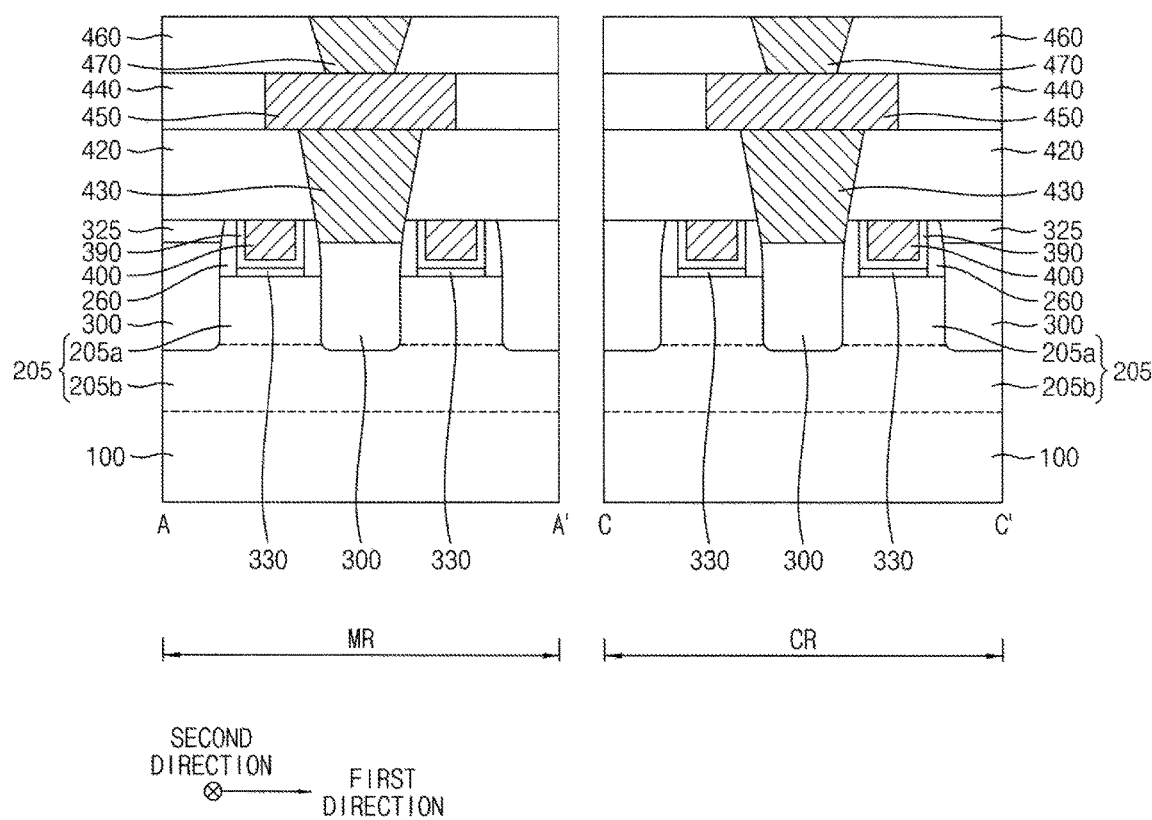

Referring to FIG. 34, wiring structures may be formed on the second insulating interlayer 420 and the contact plug 430 in the circuit region CR and the monitoring region MR of the chip region I of the wafer 200, respectively.

Particularly, a third insulating interlayer 440 may be formed on the second insulating interlayer 420 and the contact plug 430, and a lower wiring 450 may be formed through the third insulating interlayer 440 to contact the contact plug 430. A fourth insulating interlayer 460 may be formed on the third insulating interlayer 440 and the lower wiring 450, and a via 470 may be formed through the fourth insulating interlayer 460 to contact the lower wiring 450. Thus, the wiring structures, each of which includes the lower wiring 450 and the via 470, may be formed.

In some embodiments, a via mask pattern of a third photomask may be transferred to the wafer 200 to form a via pattern as a circuit pattern. For example, a circuit mask pattern of the third photomask may be transferred to form the via 470 in the cell region CR, and a monitoring mask pattern of the third photomask may be transferred to form the via 470 in the monitoring region MR.

Then, the scribe lane region II of the wafer 200 may be cut by a sawing process, and thus the wafer 200 may be divided into a plurality of chips. Each of the divided chips may be packaged to complete the semiconductor device. Alternatively, the packaging process may be performed before the sawing process.

The above processes may be repeatedly performed to mass-produce the chips including the logic devices or memory devices.

The above methods of manufacturing the photomask, the methods of forming the pattern, and the methods of manufacturing the semiconductor device using the same may be applied to methods of manufacturing various types of memory devices and systems including a wiring structure. For example, the methods may be applied to logic devices such as central processing units (CPUs), main processing units (MPUs), or application processors (APs), or the like. Additionally, the methods may be applied to volatile memory devices such as DRAM devices or SRAM devices, or non-volatile memory devices such as flash memory devices, PRAM devices, MRAM devices, ReRAM devices, or the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a photomask, the method comprising:
designing a layout of a first circuit mask pattern and a first monitoring mask pattern in a mask region corresponding to a chip region of a substrate, the first monitoring mask pattern representing a critical dimension of the first circuit mask pattern, wherein designing the layout of the first monitoring mask pattern comprises:
Locating a monitoring mask region within the mask region in a position that is not
occupied by the first circuit mask pattern; and designing the first monitoring mask pattern within the monitoring mask region; forming a first photomask comprising the first circuit mask pattern and the first monitoring mask pattern; and measuring a critical dimension of the first monitoring mask pattern of the first photomask; correcting the first circuit mask pattern in response to the measured critical dimension of the first monitoring mask pattern.

2. The method of claim 1, wherein the first monitoring mask pattern has the same dimension as at least a portion of the first circuit mask pattern.

3. The method of claim 1, wherein designing the layout of the first monitoring mask pattern comprises designing the first monitoring mask pattern outside a region of the first circuit mask pattern.

4. The method of claim 1, further comprising performing an optical proximity correction on the first monitoring mask pattern.

5. The method of claim 4, further comprising performing an optical proximity correction on the first circuit mask pattern.

6. The method of claim 5, wherein the optical proximity correction on the first monitoring mask pattern is performed separately from the optical proximity correction on the first circuit mask pattern.

7. The method of claim 1, wherein the first circuit mask pattern and the first monitoring mask pattern comprise a same light-blocking material.

8. The method of claim 1, further comprising:
designing a layout of a second circuit mask pattern and a second monitoring mask pattern in regions to which the first circuit mask pattern and the first monitoring mask pattern are transferred, respectively, the second monitoring mask pattern representing a critical dimension of the second circuit mask pattern;
forming a second photomask comprising the second circuit mask pattern and the second monitoring mask pattern; and
measuring a critical dimension of the second monitoring mask pattern.

9. A method of inspecting a photomask, the method comprising:
electronically inspecting a first mask pattern in a mask region of the photomask and refraining from electronically inspecting a separate second mask pattern in the mask region of the photomask,
wherein the first mask pattern, comprises a geometric feature that corresponds to at least a portion of the second mask pattern,
wherein the mask region is outside of a scribe lane region of the photomask,
wherein the first mask pattern is smaller than the second mask pattern,
wherein the first mask pattern represents a critical dimension of the second mask pattern,
wherein electronically inspecting comprises measuring a critical dimension of the first mask pattern, and
wherein the method further comprises adjusting the second mask pattern in response to a measurement result of the critical dimension of the first mask pattern.

10. The method of claim 9, wherein:
electronically inspecting comprises performing Scanning Electron Microscopy (SEM) imaging of the first mask pattern without performing SEM imaging of the second mask pattern.

11. The method of claim 10, further comprising:
after performing SEM imaging of the first mask pattern without performing SEM imaging of the second mask pattern, transferring the second mask pattern of the photomask to a wafer; and
after transferring the second mask pattern of the photomask to the wafer, performing After-Development Inspection (ADI) and After-Etching Inspection (AEI) on a first region of the wafer that corresponds to the first mask pattern of the photomask, without performing the ADI and the AEI on a second region of the wafer that corresponds to the second mask pattern of the photomask.

12. The method of claim 9, further comprising:
after electronically inspecting the first mask pattern, using the photomask to form a circuit pattern on a wafer, wherein the first and second mask patterns comprise a monitoring mask pattern and a circuit mask pattern, respectively.

13. The method of claim 9, further comprising transferring the first and second mask patterns to a same die region of a wafer.

14. The method of claim 13, wherein the same die region comprises one among a plurality of die regions of the wafer that are spaced apart from each other by a scribe lane region of the wafer.

15. The method of claim 1,
wherein measuring the critical dimension comprises performing imaging of the first monitoring mask pattern without performing imaging of the first circuit mask pattern, and
wherein the method further comprises:
after performing imaging of the first monitoring mask pattern without performing imaging of the first circuit mask pattern, transferring the first circuit mask pattern to a wafer; and
after transferring the first circuit mask pattern to the wafer, performing an inspection on a first region of the wafer that corresponds to the first monitoring mask pattern, without performing the inspection on a second region of the wafer that corresponds to the first circuit mask pattern.

\* \* \* \* \*